(12) United States Patent
Tsai et al.

(10) Patent No.: US 11,088,022 B2
(45) Date of Patent: Aug. 10, 2021

(54) DIFFERENT ISOLATION LINERS FOR DIFFERENT TYPE FINFETS AND ASSOCIATED ISOLATION FEATURE FABRICATION

(71) Applicant: Taiwan Semiconductor Manufacturing Co., Ltd., Hsin-Chu (TW)

(72) Inventors: Tzung-Yi Tsai, Taoyuan (TW); Tsung-Lin Lee, Hsinchu (TW); Yen-Ming Chen, Hsin-Chu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 2 days.

(21) Appl. No.: 16/276,121

(22) Filed: Feb. 14, 2019

(65) Prior Publication Data

US 2020/0105589 A1 Apr. 2, 2020

Related U.S. Application Data

(60) Provisional application No. 62/737,688, filed on Sep. 27, 2018.

(51) Int. Cl.
*H01L 21/4763* (2006.01)
*H01L 21/768* (2006.01)
(Continued)

(52) U.S. Cl.
CPC .... *H01L 21/76832* (2013.01); *H01L 21/0228* (2013.01); *H01L 21/3086* (2013.01); *H01L 21/76224* (2013.01); *H01L 21/823821* (2013.01); *H01L 21/823828* (2013.01); *H01L 21/823878* (2013.01); *H01L 27/0928* (2013.01);
(Continued)

(58) Field of Classification Search
CPC .......... H01L 21/76832; H01L 21/0228; H01L 21/3086; H01L 21/76224; H01L 21/823821; H01L 21/823878; H01L 27/0928; H01L 29/165; H01L 29/66795;
(Continued)

(56) References Cited

U.S. PATENT DOCUMENTS 6,140,208 A 10/2000 Agahi et al.
7,728,381 B2 * 6/2010 Kahng .............. H01L 29/42384
257/330

(Continued)

*Primary Examiner* — Tan N Tran
(74) *Attorney, Agent, or Firm* — Haynes and Boone, LLP

(57) ABSTRACT

Different isolation liners for different type FinFETs and associated isolation feature fabrication are disclosed herein. An exemplary method includes performing a fin etching process on a substrate to form first trenches defining first fins in a first region and second trenches defining second fins in a second region. An oxide liner is formed over the first fins in the first region and the second fins in the second region. A nitride liner is formed over the oxide liner in the first region and the second region. After removing the nitride liner from the first region, an isolation material is formed over the oxide liner and the nitride liner to fill the first trenches and the second trenches. The isolation material, the oxide liner, and the nitride liner are recessed to form first isolation features (isolation material and oxide liner) and second isolation features (isolation material, nitride liner, and oxide liner).

19 Claims, 15 Drawing Sheets

(51) Int. Cl.
*H01L 27/092* (2006.01)
*H01L 29/165* (2006.01)
*H01L 29/06* (2006.01)
*H01L 29/78* (2006.01)
*H01L 21/762* (2006.01)
*H01L 29/66* (2006.01)
*H01L 21/8238* (2006.01)
*H01L 21/308* (2006.01)
*H01L 21/02* (2006.01)

(52) U.S. Cl.
CPC ........ *H01L 29/0649* (2013.01); *H01L 29/165* (2013.01); *H01L 29/66545* (2013.01); *H01L 29/66795* (2013.01); *H01L 29/7851* (2013.01)

(58) Field of Classification Search
CPC ........... H01L 29/0649; H01L 29/66545; H01L 29/7851
USPC ......................................... 438/265, 634, 700
See application file for complete search history.

(56) References Cited

U.S. PATENT DOCUMENTS

| | | |
|---|---|---|
| 9,087,870 B2 | 7/2015 | Tong et al. |
| 9,455,204 B1 * | 9/2016 | Cao ................. H01L 21/823821 |
| 9,870,956 B2 | 1/2018 | Chen et al. |
| 9,881,918 B1 * | 1/2018 | Huang ................ H01L 21/2254 |
| 9,991,262 B1 * | 6/2018 | Ching .................. H01L 29/161 |
| 10,068,804 B2 * | 9/2018 | Xie .................. H01L 29/66795 |
| 10,535,517 B2 * | 1/2020 | Lee .................. H01L 21/02532 |
| 2002/0031890 A1 | 3/2002 | Watanabe et al. |
| 2014/0225219 A1 | 8/2014 | Huang et al. |
| 2014/0264725 A1 | 9/2014 | Chuang et al. |
| 2014/0374838 A1 | 12/2014 | Chen et al. |

* cited by examiner

DIFFERENT ISOLATION LINERS FOR DIFFERENT TYPE FINFETS AND ASSOCIATED ISOLATION FEATURE FABRICATION

This is a non-provisional application of and claims benefit of U.S. Provisional Patent Application Ser. No. 62/737,688, filed Sep. 27, 2018, the entire disclosure of which is incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, as fin-like field effect transistor (FinFET) technologies progress towards smaller feature sizes, different type FinFETs are configured with different fin materials to further enhance performance. Since different fin materials respond differently to subsequent processing, critical dimensions of first fins of a first material may be different than critical dimensions of second fins of a second material after various fabrication stages. In particular, after a fin etching process, it has been observed that fin width consumption is different during annealing processes associated with forming isolation features, such that fin width of the first fins is different than fin width of the second fins after isolation feature formation. Consequently, not all advantages of FinFETs can be realized.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
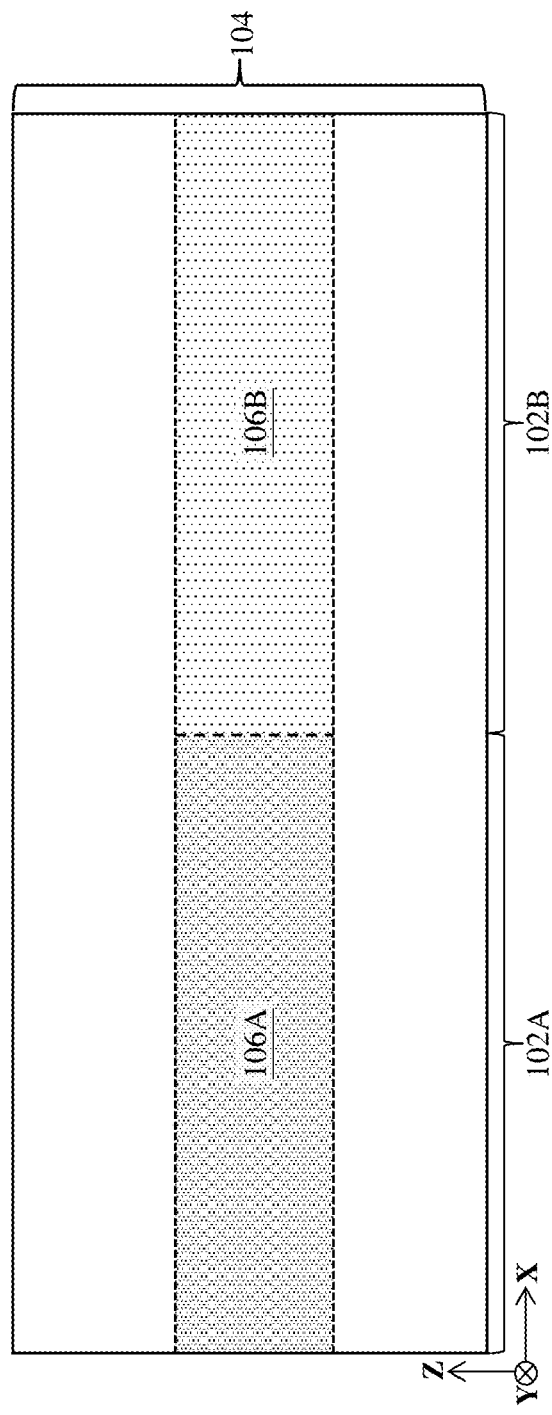
FIGS. 1-12, FIG. 13A, and FIG. 13B are fragmentary cross-sectional views of a FinFET device, in portion or entirety, at various fabrication stages according to various aspects of the present disclosure.

The present disclosure relates generally to fin-like field effect transistor (FinFET) devices, and more particularly, to isolation features for FinFETs and associated methods of fabricating isolation features.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

For advanced IC technology nodes, FinFETs (also referred to as non-planar transistors) have become a popular and promising candidate for high performance and low leakage applications. To enhance channel mobility, different type FinFETs are often configured with different fin materials (in particular, different channel materials). Since different fin materials respond differently to subsequent processing, challenges have arisen during FinFET fabrication. For example, different etching rates, different oxidation rates, and/or other different characteristics of silicon and silicon germanium have lead to critical dimensions of silicon fins (which are often implemented in n-type FinFETs) being different than critical dimensions of silicon germanium fins (which are often implemented in p-type FinFETs) after various fabrication stages. In particular, after a fin etching process, it has been observed that fin width consumption is different during annealing processes associated with forming isolation features (for example, shallow trench isolation features), such that silicon fin width is different than silicon germanium fin width after isolation feature formation. Such fin width differences are exacerbated by further processing. In some instances, liners of the isolation features contribute to the fin width differences. For example, it has been observed that an isolation liner that minimizes silicon germanium fin consumption during isolation feature formation may minimize silicon fin consumption too much, leading to silicon fins having larger than desirable fin widths, which can lead to detrimental short-channel effects in n-type FinFETs and/or negatively affect subsequent gate formation (for example, by decreasing spacing between silicon fins and consequently decreasing a gate fill window).

The present disclosure addresses such challenges by implementing different isolation liners for different type FinFETs. In some implementations, isolation features for n-type FinFETs have an oxide liner, and isolation features for p-type FinFETs have an oxide liner and a nitride liner. Such combination of isolation liners has been observed to balance fin width consumption during isolation feature formation. In some implementations, the oxide liner and nitride liner can minimize consumption of silicon germanium fins. In some implementations, removing the nitride liner from isolation features for n-type FinFETs can increase consumption of silicon fins and reduce current leakage paths that may result from fixed charge at interfaces of the nitride liner and the silicon fins. The present disclosure further provides methods for fabricating such isolation liners and associated isolation features.

FIGS. 1-12, 13A, and 13B are fragmentary cross-sectional views of a FinFET device 100, in portion or entirety, at various fabrication stages according to various aspects of the present disclosure. In the depicted embodiment, FinFET device 100 includes an n-type FinFET region 102A configured to include an n-type FinFET and a p-type FinFET region 102B configured to include a p-type FinFET, such that FinFET device 100 includes a complementary FinFET. In some implementations, n-type FinFET region 102A and p-type FinFET region 102B are a portion of a device region, such as a core region (often referred to as a logic region), a memory region (such as a static random access memory (SRAM) region), an analog region, a peripheral region (often referred to as an I/O region), a dummy region, other suitable region, or combinations thereof. The device region can include various passive and active microelectronic devices, such as resistors, capacitors, inductors, diodes, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some implementations, FinFET device 100 may be a portion of an IC chip, a system on chip (SoC), or portion thereof. FIGS. 1-12, 13A, and 13B have been simplified for the sake of clarity to better understand the inventive concepts of the present disclosure. Additional features can be added in FinFET device 100, and some of the features described below can be replaced, modified, or eliminated in other embodiments of FinFET device 100.

Turning to FIG. 1, FinFET device 100 includes a substrate (wafer) 104. In the depicted embodiment, substrate 104 includes silicon. Alternatively or additionally, substrate 104 includes another elementary semiconductor, such as germanium; a compound semiconductor, such as silicon carbide, silicon phosphide, gallium arsenide, gallium phosphide, indium phosphide, indium arsenide, and/or indium antimonide; an alloy semiconductor, such as silicon germanium (SiGe), SiPC, GaAsP, AlInAs, AlGaAs, GaInAs, GaInP, and/or GaInAsP; or combinations thereof. Alternatively, substrate 104 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. In some implementations, substrate 104 includes one or more group III-V materials, one or more group II-IV materials, or combinations thereof.

Substrate 104 includes various doped regions configured according to design requirements of FinFET device 100. In some implementations, substrate 104 includes p-type doped regions (for example, p-type wells) doped with p-type dopants, such as boron (for example, $BF_2$), indium, other p-type dopant, or combinations thereof. In some implementations, substrate 104 includes n-type doped regions (for example, n-type wells) doped with n-type dopants, such as phosphorus, arsenic, other n-type dopant, or combinations thereof. In some implementations, substrate 104 includes doped regions formed with a combination of p-type dopants and n-type dopants. The various doped regions can be formed directly on and/or in substrate 104, for example, providing a p-well structure, an n-well structure, a dual-well structure, a raised structure, or combinations thereof. In the depicted embodiment, substrate 104 includes a p-type well 106A configured for n-type FinFET region 102A and an n-type well 106B configured for p-type FinFET region 102B. An ion implantation process, a diffusion process, an annealing process, and/or other suitable doping process can be performed to form the various doped regions, including p-type well 106A and/or n-type well 106B.

Figure 2:
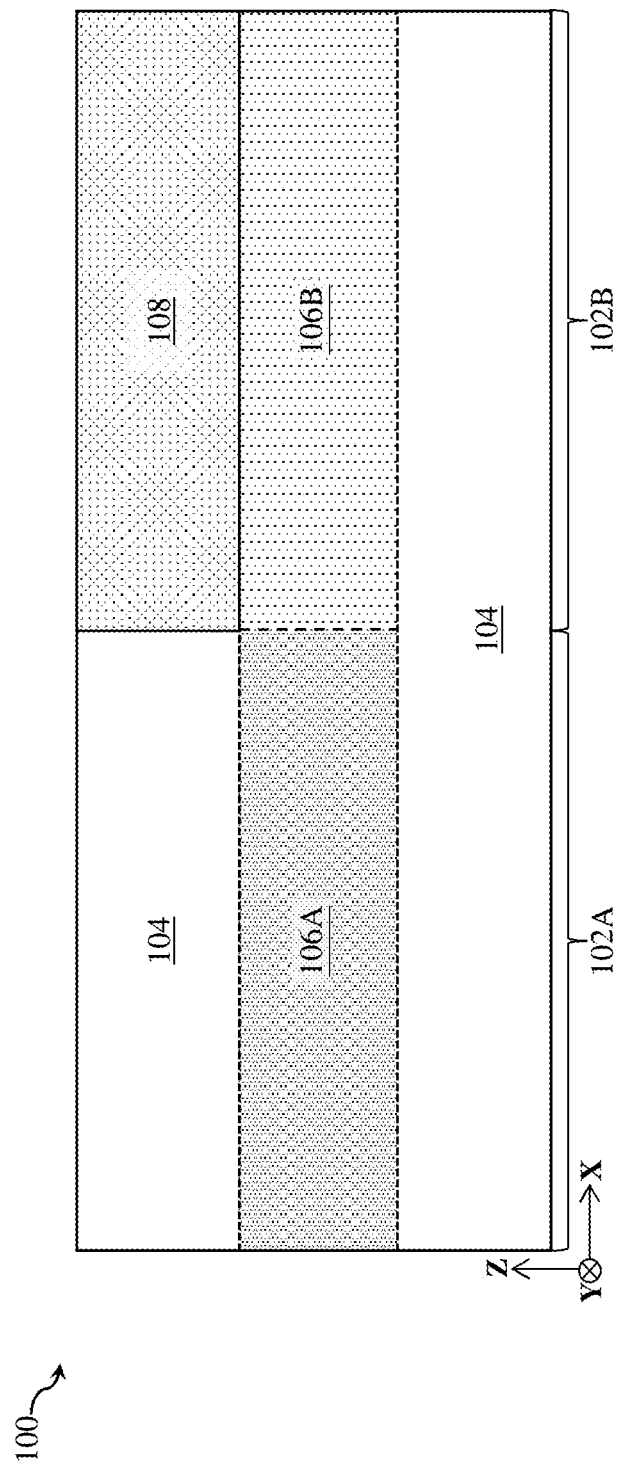

Turning to FIG. 2, a semiconductor layer 108 is formed in p-type FinFET region 102B. A material of semiconductor layer 108 is different than a material of substrate 104. For example, where substrate 104 includes silicon, semiconductor layer 108 includes silicon and germanium. Substrate 104, p-type well 106A, n-type well 106B, and semiconductor layer 108 can collectively be referred to as a device substrate. In some implementations, a patterning process is performed on a bulk substrate, such as substrate 104, to form semiconductor layer 108. The patterning process can include forming a patterned masking layer over substrate 104 that covers n-type FinFET region 102A and exposes p-type FinFET region 102B, recessing (etching) substrate 104 in p-type FinFET region 102B, and epitaxially growing a semiconductor material (in the depicted embodiment, silicon germanium) that fills the recess in p-type FinFET region 102B. In such implementations, a top surface of substrate 104 in p-type FinFET region 102B is lower than a top surface of substrate 104 in n-type FinFET region 102A after the recessing. In the depicted embodiment, a portion of substrate 104 in p-type FinFET region 102B is removed to expose a top surface of n-type well 106B. In some implementations, the recess in p-type FinFET region 102A does not extend to n-type well 106B or extends into n-type well 106B. Other methods for forming semiconductor layer 108 are contemplated by the present disclosure.

Figure 3:
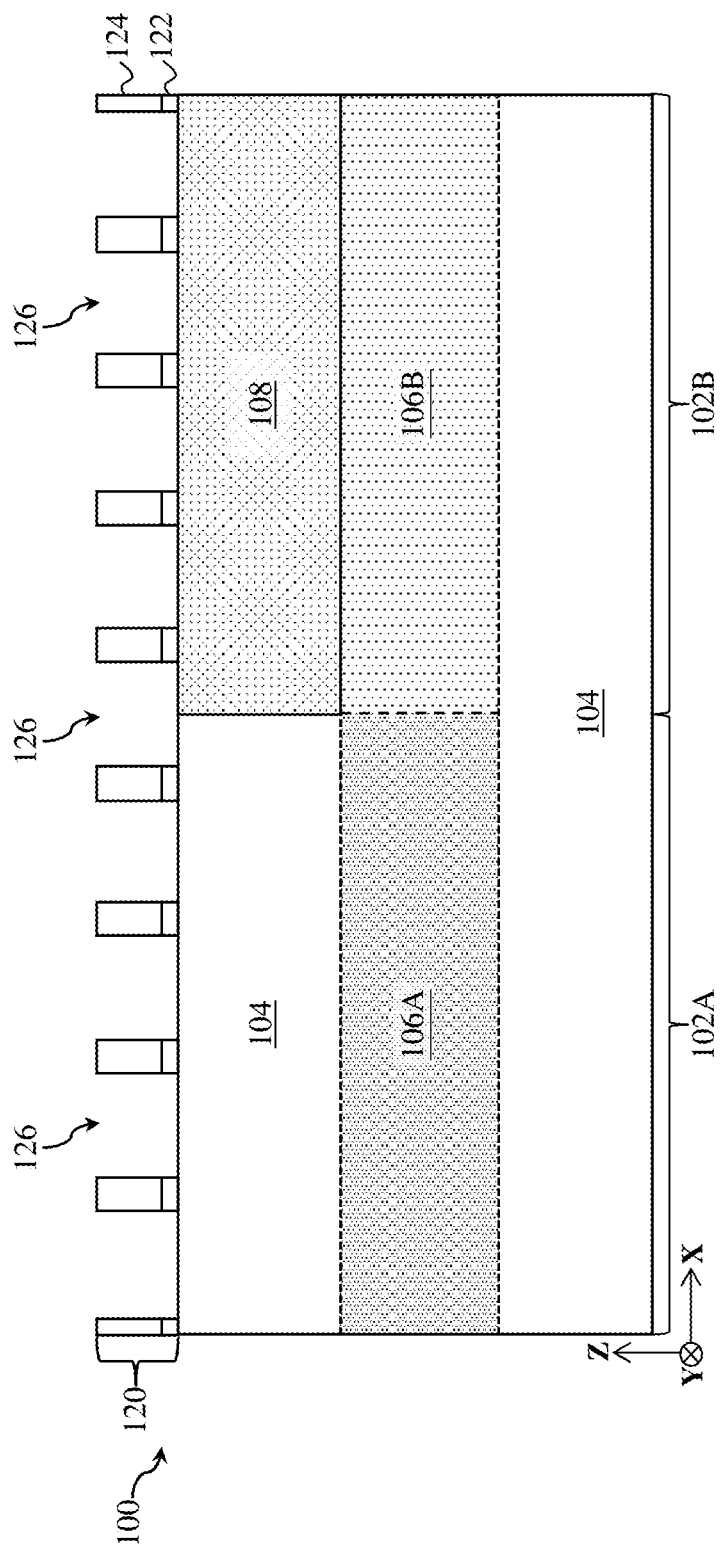

Turning to FIG. 3, a patterning layer 120 is formed over the device substrate. Patterning layer 120 includes a material that is different than a material of the device substrate to achieve etching selectivity during a fin etching process. In the depicted embodiment, patterning layer 120 includes a pad layer 122 and a mask layer 124, where pad layer 122 is disposed on the device substrate and mask layer 124 is disposed on pad layer 122. In some implementations, pad layer 122 includes silicon and oxygen, and mask layer 124 includes silicon and nitrogen. For example, pad layer 122 is a silicon oxide layer formed by thermal oxidation and/or other suitable process, and mask layer 124 is a silicon nitride layer or a silicon oxynitride layer formed by chemical vapor deposition (CVD), low pressure CVD (LPCVD), plasma enhanced CVD (PECVD), thermal nitridation (for example, of silicon), other suitable process, or combinations thereof. In some implementations, pad layer 122 includes a material that can promote adhesion between the device substrate and mask layer 124 and can further act as an etch stop layer when etching mask layer 124. Other materials for and/or methods for forming pad layer 122 and/or mask layer 124 are contemplated by the present disclosure. Patterning layer 120 includes openings 126 that expose the device substrate. In some implementations, widths of patterning layer 120 disposed between openings 126 are substantially equal to desired widths (also referred to as critical dimensions) of fins of FinFET device 100. In some implementations, widths of patterning layer 120 disposed between openings are greater than the desired widths of fins of FinFET device 100 to compensate for consumption of the fins during subsequent process.

Openings 126 are defined by performing a lithography process to form a patterned resist layer over patterning layer 120 and performing an etching process to transfer a pattern defined in the patterned resist layer to patterning layer 120. The lithography process can include forming a resist layer on mask layer 124 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process uses the patterned resist layer as an etch mask to remove portions of patterning layer 120, thereby forming openings 126 that extend through pad layer 122 and mask layer 124. The etching process can include a dry etching process (for example, a reactive ion etching (RIE) process), a wet etching process, other suitable etching process, or combinations thereof. After the etching process, the patterned resist layer can be removed, for example, by a resist stripping process. The patterned resist layer can be removed before or after a fin etching process. Alternatively, the exposure process can implement maskless lithography, electron-beam writing, ion-beam writing and/or nanoprint technology.

Figure 4:
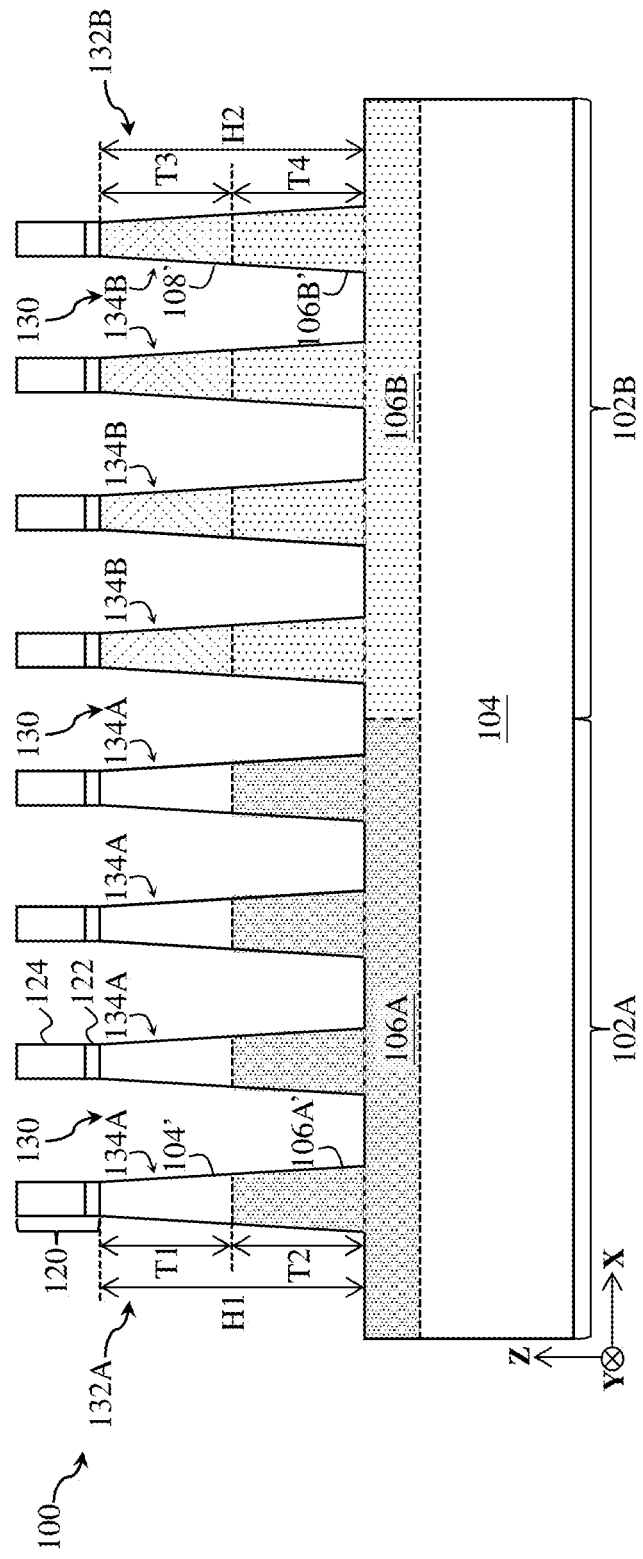

Turning to FIG. 4, a fin etching process is performed using patterning layer 120 as a mask. The fin etching process removes portions of the device substrate exposed by openings 126 to form trenches 130 that define a fin structure 132A (having fins 134A extending from substrate 104) in n-type FinFET region 102A and a fin structure 132B (having fins 134B extending from substrate 104) in p-type FinFET region 102B. Fins 132A, 132B are defined between adjacent trenches 130, which have sidewalls defined by sidewalls of fins 134A and/or fins 134B and bottoms defined by top surfaces of substrate 104 (here, top surfaces of p-type well 106A and n-type well 106B defined in substrate 104). The present disclosure contemplates embodiments where fin structures 132A, 132B include more or less fins than depicted in FIG. 4. Fins 134A, 134B are oriented substantially parallel to one another. Fins 134A, 134B each have a width defined in an x-direction, a length defined in a y-direction, and a height defined in a z-direction. Fins 134A have a height H1 (defined between a top surface of substrate 104 (here, a top surface of p-type well 106A defined in substrate 104) and a top surface of fins 134A), and fins 134B have a height H2 (defined between a top surface of substrate 104 (here, a top surface of n-type well 106B defined in substrate 104) and a top surface of fins 134B). In the depicted embodiment, height H1 is substantially equal to height H2, though the present disclosure contemplates configurations where fins 134A and fins 134B have different heights. In some implementations, heights H1, H2 are about 100 nm to about 140 nm. Fins 134A include an etched portion of substrate 104 (referred to hereinafter as a silicon layer 104' having a thickness T1) and an etched portion of p-type well 106A (referred to hereinafter as p-type doped silicon layer 106A' having a thickness T2). Fins 134B include an etched portion of semiconductor layer 108 (referred to hereinafter as a silicon germanium layer 108' having a thickness T3) and an etched portion of n-type well 106B (referred to hereinafter as n-type doped silicon layer 106B' having a thickness T4). In the depicted embodiment, thickness T1 is substantially equal to thickness T2, and thickness T3 is substantially equal to thickness T4, though the present disclosure contemplates configurations where thickness T1 and thickness T2 are different and/or thickness T3 and thickness T4 are different. In some implementations, thicknesses T1, T2 are about 40 nm to about 80 nm, and thickness T3, T4 are about 40 nm to about 80 nm. In some implementations, the fin etching process does not etch entirely through substrate 104 and semiconductor layer 108 to p-type well 106A and n-type well 106B. The etching process is a dry etching process, a wet etching process, or combinations thereof. In some implementations, the fin etching process is an anisotropic dry etching process (for example, a reactive ion etch (RIE) process). In some implementations, a dry etching process implements an etchant gas that includes a fluorine-containing etchant gas (for example, $CF_4$, $SF_6$, $CH_2F_2$, $CHF_3$, and/or $C_2F_6$), an oxygen-containing gas, a chlorine-containing gas (for example, $Cl_2$, $CHCl_3$, $CCl_4$, and/or $BCl_3$), a bromine-containing gas (for example, HBr and/or $CHBR_3$), an iodine-containing gas, other suitable gases and/or plasmas, or combinations thereof.

The present disclosure further contemplates embodiments where fins 134A and fins 134B are formed by a multiple patterning process, such as a double patterning lithography (DPL) process (for example, a lithography-etch-lithography-etch (LELE) process, a self-aligned double patterning (SADP) process, a spacer-is-dielectric patterning (SIDP) process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. Generally, double patterning processes and/or multiple patterning processes combine lithography processes and self-aligned processes, allowing patterns to be created that have, for example, pitches smaller than what is otherwise obtainable using a single, direct lithography process. For example, in some implementations, a patterned sacrificial layer is formed over a substrate using a lithography process, and spacers are formed alongside the patterned sacrificial layer using a self-aligned process. Then, the patterned sacrificial layer is removed, and the spacers can be used to pattern the substrate (for example, fin layer 110) to form fins, such as fins 134A and fins 134B. In some implementations, directed self-assembly (DSA) techniques are implemented while forming fins 134A and fins 134B.

Figure 5:
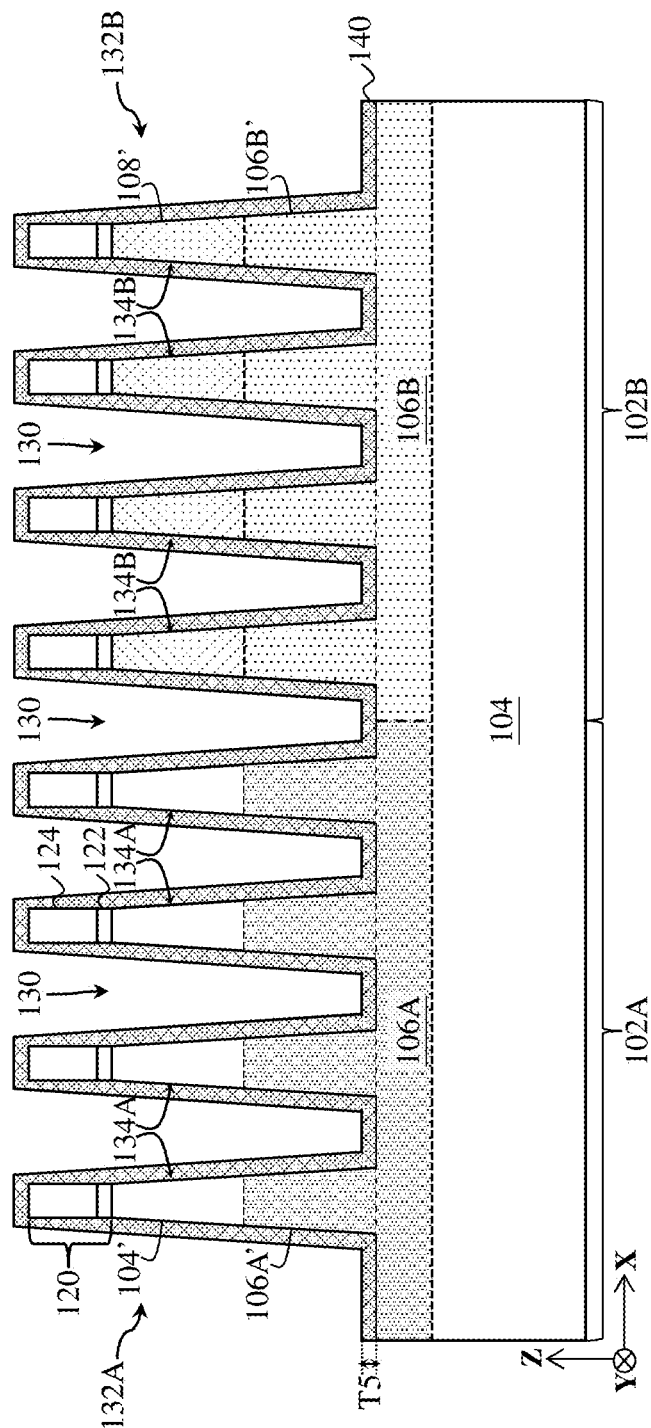

Turning to FIG. 5, an oxide liner 140 is formed over fin structure 132A in n-type FinFET region 102A and fin structure 132B in p-type FinFET region 102B. Oxide liner 140 covers substrate 104, patterning layer 120 (here, pad layer 122 and mask layer 124), fins 134A (here, including silicon layer 104' and p-type doped silicon layer 106A'), and fins 134B (here, including silicon germanium layer 108' and n-type doped silicon layer 106B'), such that oxide liner 140 is disposed on sidewalls and bottoms of trenches 130. In the depicted embodiment, an atomic layer deposition (ALD) process conformally deposits oxide liner 140, such that oxide liner 140 has a substantially uniform thickness T5 (for example, about 1 nm to about 3 nm). In such implementations, oxide liner 140 can be referred to as an ALD oxide layer that includes an oxygen-containing dielectric material. In some implementations, oxide liner 140 includes silicon and oxygen, such as a silicon oxide layer. In some implementations, a plasma-enhanced ALD process utilizes sequential, alternate pulses of a silicon-containing precursor and an oxygen-containing plasma, where the silicon-containing precursor and the oxygen-containing plasma react with exposed surfaces of FinFET device 100 separately in a self-limiting manner. Each ALD cycle of the ALD process can include at least two deposition phases and at least two purge phases: (1) an oxygen-containing plasma pulse that exposes FinFET device 100 to an oxygen-containing plasma, which reacts with exposed surfaces of FinFET device 100, (2) a purge that removes any remaining oxygen-containing plasma and associated byproducts, (3) a silicon-containing pulse that exposes FinFET device 100 to a silicon-containing precursor (for example, a silane precursor, such as Si—N—C—H silane), which reacts with exposed surfaces of FinFET device 100, (4) a purge that removes any remaining silicon-containing precursor and associated byproducts. Note that either the oxygen-containing plasma or the silicon-containing precursor can be introduced first during the ALD process. Each ALD cycle is a self-limiting process, where less than or equal to about one oxygen-containing monolayer is deposited during each ALD cycle. The ALD cycle is repeated until oxide liner 140 reaches a desired (target) thickness. Exemplary silicon-containing precursors include silane ($SiH_4$), dichlorosilane (DCS), tetraethylorthosilicate (TEOS), other suitable silicon-containing precursors, or combinations thereof. A carrier gas can be used to deliver the silicon-containing precursors. In some implementations, the carrier gas is an inert gas, such as an argon-containing gas, a helium-containing gas, other suitable inert gas, or combinations thereof. In the depicted embodiment, the oxygen-containing plasma is generated from an oxygen-containing gas, such as oxygen ($O_2$). In such implementations, the oxygen-containing plasma includes oxygen-containing excited neutral molecules (for example, $O_2^*$), oxygen-containing ionized molecules (for example, $O_2^+$), oxygen-containing atoms (for example, O), ionized atoms ($O^+$), or combinations thereof. An inert gas (for example, an argon-containing gas) can be used when forming the oxygen-containing plasma. In some implementations, the oxygen-containing plasma is generated by a radio frequency (RF) power source (for example, by applying a RF field to a low-pressure gas using two capacitively coupled plates). In some implementations, oxide liner 140 includes n-type dopants and/or p-type dopants. In some implementations, oxide liner 140 is formed by CVD, physical vapor deposition (PVD), high density plasma CVD (HDPCVD), metal organic CVD (MOCVD), remote plasma CVD (RPCVD), PECVD, LPCVD, atmospheric pressure CVD (APCVD), sub-atmospheric vapor deposition (SAVCD), other suitable methods, or combinations thereof. In some implementations, oxide liner 140 is formed by exposing fins 134A, fins 134B, and substrate 104 to an oxygen-containing environment, thereby oxidizing surfaces of fins 134A, fins 134B, and substrate 104 (each of which include silicon). For example, a local oxidation of silicon (LOCOS) process, which can implement oxygen ($O_2$) as a process gas, can be performed to form oxide liner 140. In some implementations, oxide liner 140 is formed using in-situ steam generation (ISSG). ISSG exposes fins 134A, fins 134B, and substrate 104 to steam formed from a combined gas of hydrogen ($H_2$) and oxygen ($O_2$), which can oxidize surfaces of fins 134A, fins 134B, and substrate 104.

Figure 6:
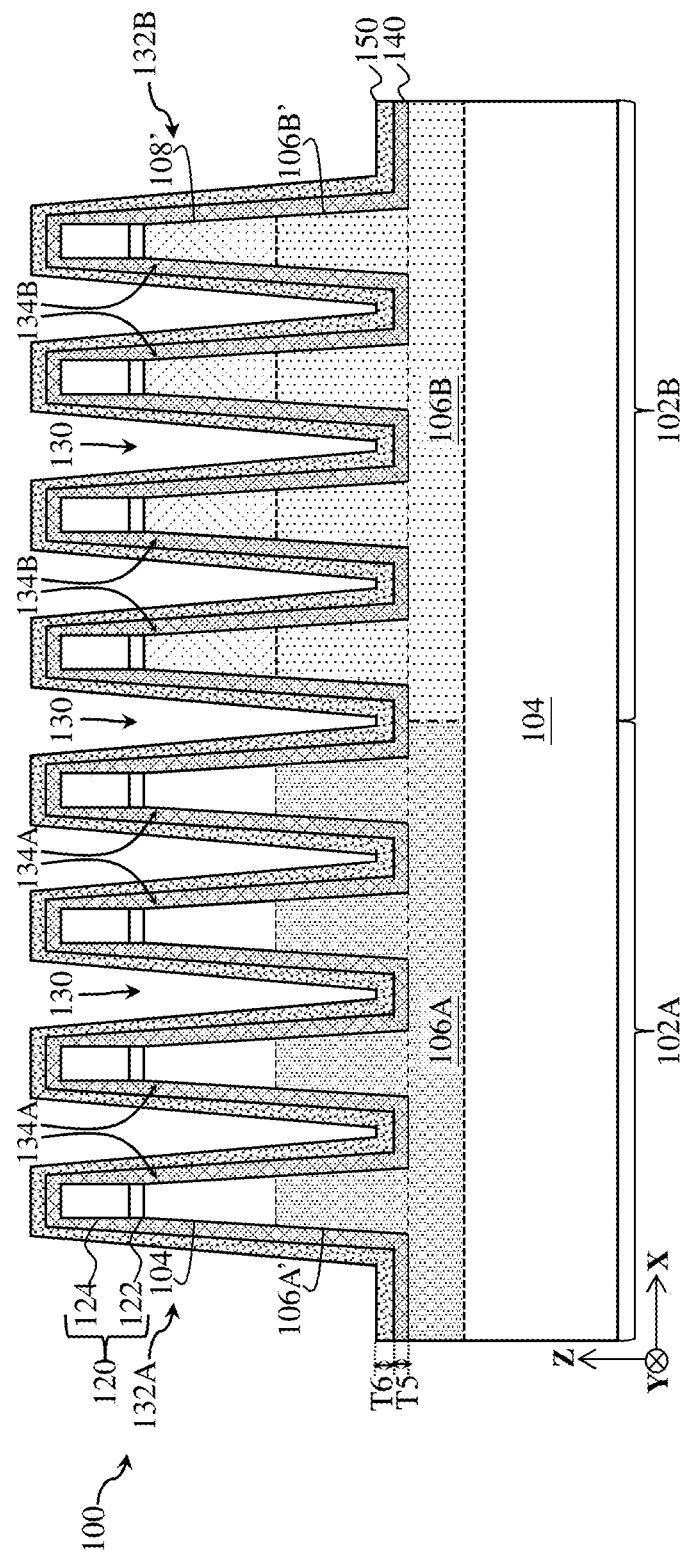

Turning to FIG. 6, a nitride liner 150 is formed over fin structure 132A in n-type FinFET region 102A and fin structure 132B in p-type FinFET region 102B. Nitride liner 150 covers substrate 104, patterning layer 120 (here, pad layer 122 and mask layer 124), fins 134A (here, including silicon layer 104' and p-type doped silicon layer 106A'), and fins 134B (here, including silicon germanium layer 108' and n-type doped silicon layer 106B'), such that nitride liner 150 is disposed on oxide liner 140 covering sidewalls and bottoms of trenches 130. In the depicted embodiment, an ALD process conformally deposits nitride liner 150, such that nitride liner 150 has a substantially uniform thickness T6. In such implementations, nitride liner 150 can be referred to as an ALD nitride layer. In some implementations, a thickness of nitride liner 150 is greater than oxide liner 140 (in other words, T6>T5). For example, thickness T6 is about 2 nm to about 3 nm. In some implementations, a ratio of a thickness of oxide liner 140 to a thickness of nitride liner 150 is about 2:3 (in other words, T5:T6 is about 2:3). Such can be referred to as a liner thickness ratio. Nitride liner 150 includes a nitrogen-containing dielectric material. In some implementations, nitride liner 150 includes silicon and nitrogen. For example, nitride liner 150 is a silicon nitride layer. In such implementations, an ALD process utilizes sequential, alternate pulses of a nitrogen-containing precursor and a silicon-containing precursor, where the nitrogen-containing precursor and the silicon-containing precursor react with exposed surfaces of FinFET device 100 separately in a self-limiting manner. Each ALD cycle of the ALD process can include at least two deposition phases and at least two purge phases: (1) an oxygen-containing pulse that exposes FinFET device 100 to a nitrogen-containing precursor, which reacts with exposed surfaces of oxide liner 140, (2) a nitrogen-containing purge that removes any remaining nitrogen-containing precursor and associated byproducts, (3) a silicon-containing pulse that exposes FinFET device 100 to a silicon-containing precursor, which reacts with exposed surfaces of oxide liner 140, (4) a silicon-containing purge that removes any remaining silicon-containing precursor and associated byproducts. Note that either the nitrogen-containing precursor or the silicon-containing precursor can be introduced first during the ALD process. Each ALD cycle is a self-limiting process, where less than or equal to about one nitrogen-containing monolayer is deposited during each ALD cycle. The ALD cycle is repeated until nitride liner 150 reaches a desired (target) thickness. Exemplary silicon-containing precursors include silane ($SiH_4$), dichlorosilane (DCS), tetraethylorthosilicate (TEOS), other suitable silicon-containing precursors, or combinations thereof. Exemplary nitrogen-containing precursors include nitrogen ($N_2$), ammonia ($NH_3$), other suitable nitrogen-containing precursors, or combinations thereof. In some implementations, nitride liner 150 includes n-type dopants and/or p-type dopants. Alternatively, in some implementations, nitride liner 150 is formed by CVD, PVD, HDPCVD, MOCVD, RPCVD, PECVD, LPCVD, APCVD, SAVCD, other suitable methods, or combinations thereof.

Figure 7:
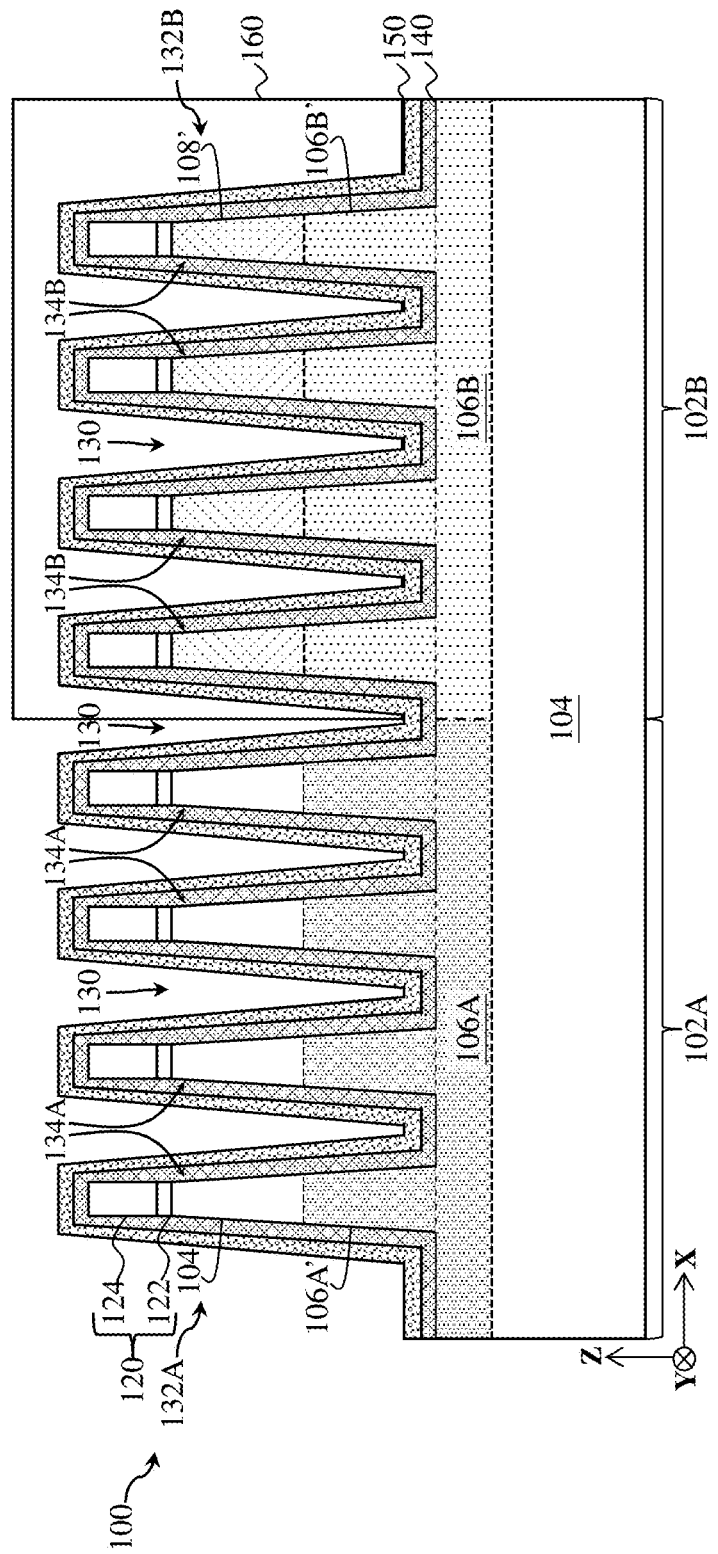
Figure 8:
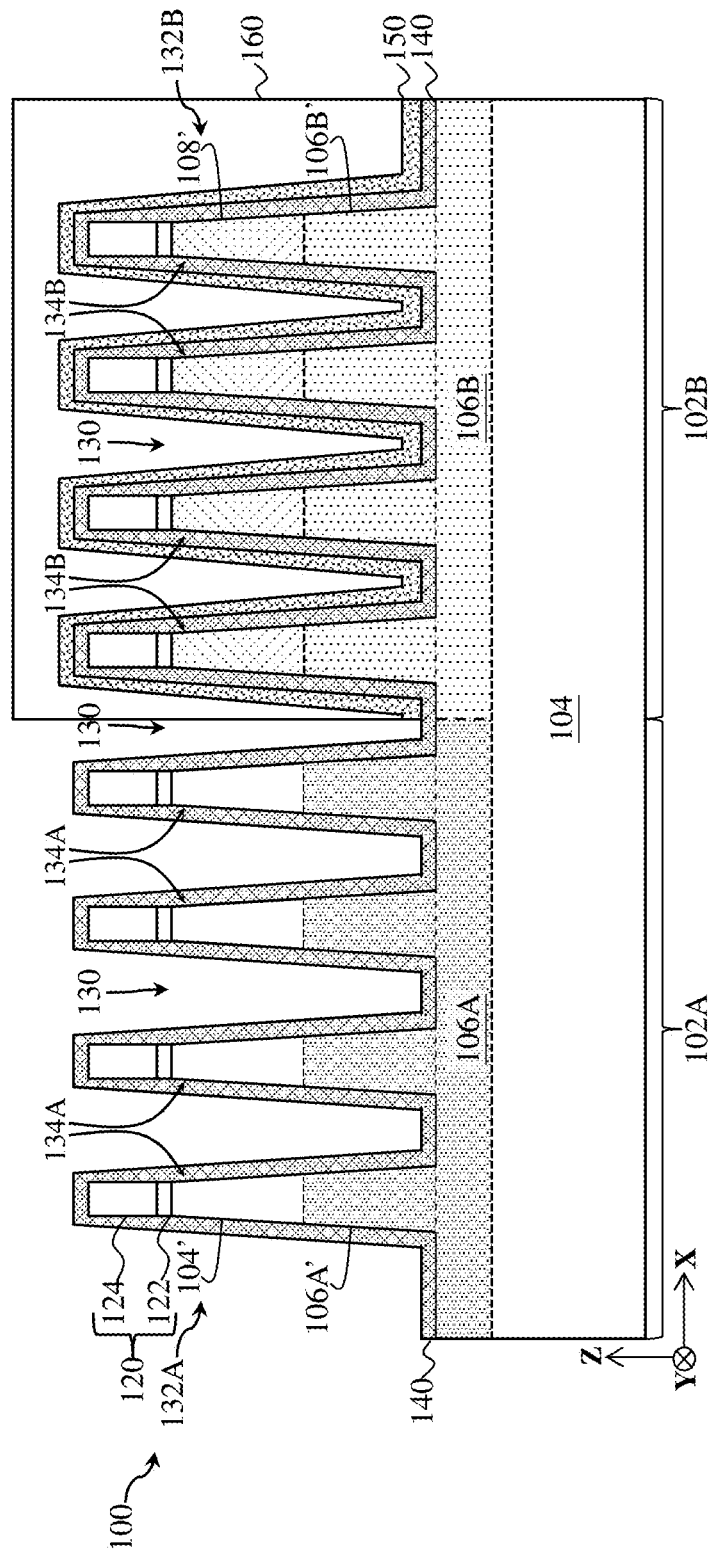
Figure 9:
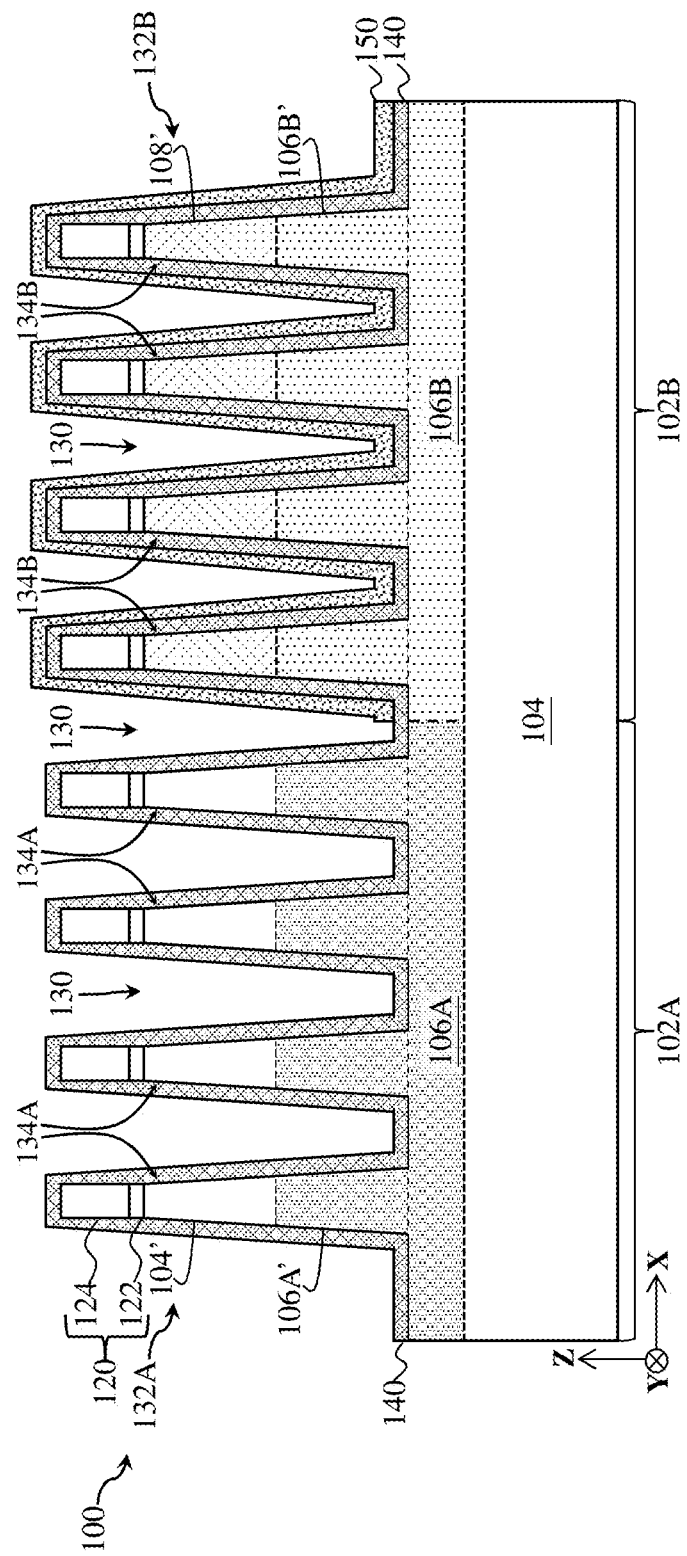

Turning to FIGS. 7-9, nitride liner 150 is removed from n-type FinFET region 102A. In FIG. 7, a patterned mask layer 160 is formed over FinFET device 100 that exposes n-type FinFET region 102A and covers p-type FinFET region 102B. In FIG. 8, an etching process is performed to remove nitride liner 150 from n-type FinFET region 102A. The etching process is a dry etching process, a wet etching process, or combination thereof. In the depicted embodiment, the etching process selectively etches nitride liner 150 without (or minimally) etching oxide liner 140, such that oxide liner 140 remains in n-type FinFET region 102A. Thereafter, in FIG. 9, patterned mask layer 160 is removed from FinFET device 100, for example, by a resist stripping process and/or other suitable process. Oxide liner 140 partially fills trenches 130 in n-type FinFET region 102A, and nitride liner 150 and oxide liner 140 partially fill trenches 130 in p-type FinFET region 102B.

Figure 10:
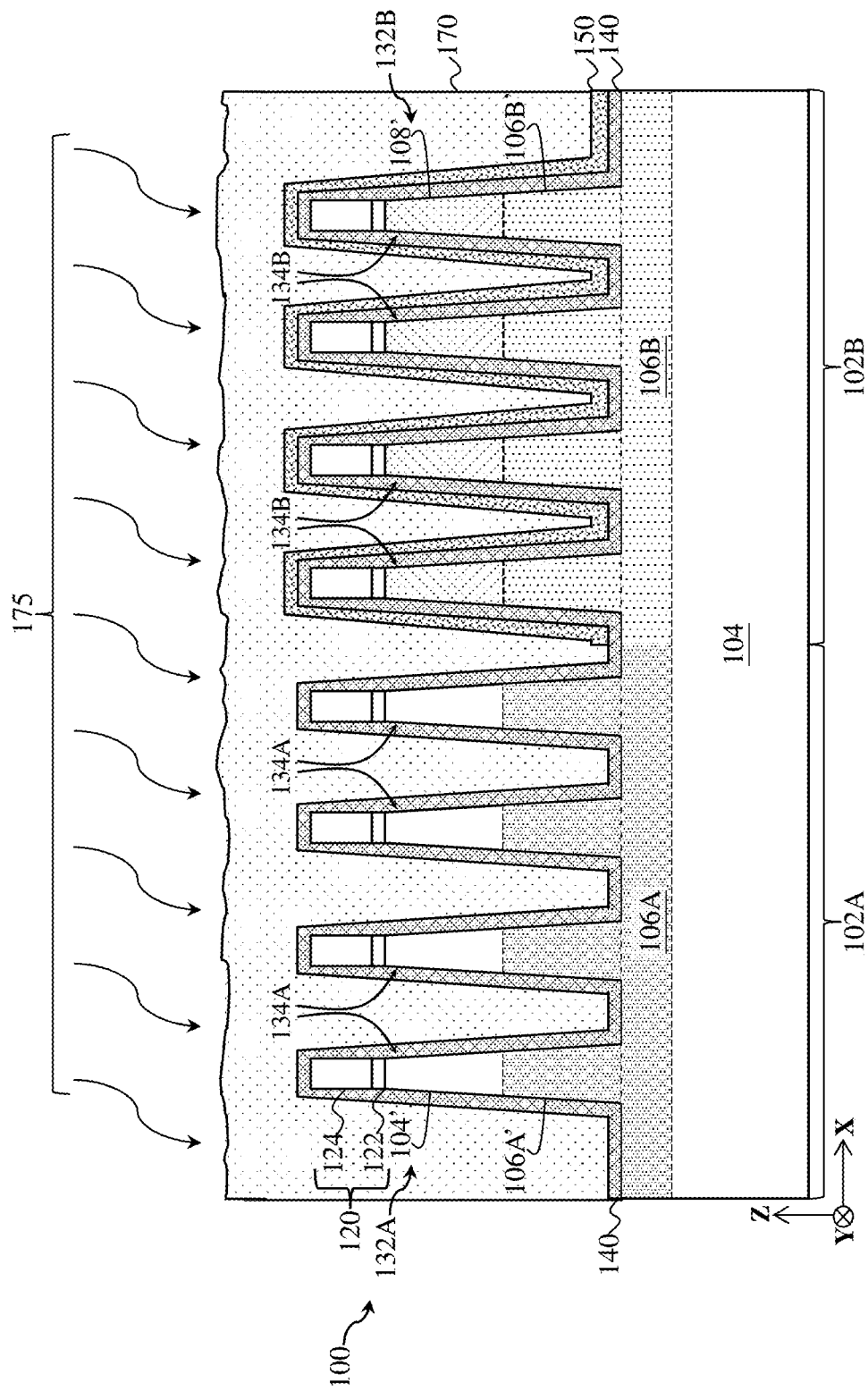

Turning to FIG. 10, an isolation material 170 is formed over oxide liner 140 and/or nitride liner 150 to fill any remaining portions of trenches 130, such as those portions not filled by oxide liner 140 and/or nitride liner 150. In the depicted embodiment, isolation material 170 is formed by a flowable chemical vapor deposition (FCVD) process 175, which includes depositing a flowable dielectric material (in some implementations, in a liquid state) over substrate 104 and converting the flowable dielectric material into a solid material. The flowable dielectric material flows into trenches 130 and conforms to exposed surfaces of FinFET device 100, enabling void free filling of trenches 130. For example, the FCVD process introduces a silicon-containing precursor and an oxidizer (collectively referred to as reactants) into a deposition chamber, where the silicon-containing precursor and the oxidizer react and condense onto exposed surfaces of FinFET device 100 (for example, oxide liner 140 and/or nitride liner 150) to form a flowable dielectric material. In some implementations, the flowable dielectric material is a flowable silicon-oxygen-and-nitrogen containing material, where the flowable silicon-oxygen-and-nitrogen containing material includes Si—OH, Si—H, Si—O, and/or Si—N bonds. In some implementations, the silicon-containing precursor is a silazene-based precursor, such as polysilazane, silylamine, ditrisilylamine, dimethylsilane, trimethylsilane, tetramethylsilane, diethylsilane, other suitable silicon-containing precursor, or combinations thereof. In some implementations, the oxidizer includes oxygen and/or nitrogen, such as $O_2$, $O_3$, ammonia ($NH_3$), $N_2O$, $NO_2$, nitric oxide (NO), hydrogen peroxide ($H_2O_2$), $H_2O$, other suitable oxygen and/or nitrogen containing constituents, or combinations thereof. In some implementations, the silicon-containing precursor, such as the silazene-based precursor, is introduced into the deposition chamber in a liquid or vapor state. In some implementations, the oxidizer is excited to an ionized state by plasma, such that the oxidizer is introduced into the deposition chamber in a plasma state. In some implementations, the silicon-containing precursor and/or the oxidizer is mixed with a carrier gas, before or after introduction into the deposition chamber. The carrier gas includes any constituent that does not materially affect intended flowable characteristics of the flowable dielectric material and/or isolation characteristics and/or solid characteristics upon curing the flowable dielectric material. Exemplary carrier gases include hydrogen, helium, argon, nitrogen, xenon, krypton, neon, or combinations thereof.

An annealing process is then performed to convert the flowable dielectric material into a solid dielectric layer. In the depicted embodiment, the annealing process converts the flowable silicon-oxygen-and-nitrogen material into a silicon-and-oxygen containing layer, such as a silicon oxide layer. Isolation layer 170 may thus be referred to as a silicon oxide layer. In such embodiments, the annealing process promotes formation of Si—Si and/or Si—O bonds and reduces Si—N and/or Si—H bonds. In some implementations, the annealing process converts Si—OH, Si—H, and/or Si—N bonds into Si—O bonds. In some implementations, the annealing process is a thermal annealing process that heats FinFET device 100 to a temperature that can facilitate conversion of the flowable dielectric material into the solid dielectric layer. In some implementations, the thermal annealing process is performed at a temperature of about 100° C. to about 700° C. The thermal annealing process can heat FinFET device 100 via a substrate stage (on which substrate 104 is secured), a lamp source, a laser source, other source, or combinations thereof. In some implementations, the flowable dielectric material is exposed to UV radiation during the annealing process. In some implementations, the flowable dielectric material is exposed to UV light having a wavelength of about 300 nm to about 600 nm. In some implementations, FinFET device 100 is exposed to an oxygen-containing environment during the annealing process. Alternatively or additionally, isolation material 170 is formed by a high aspect ratio process (HARP) (implementing, for example, a TEOS precursor and an $O_3$ precursor), HDPCVD (implementing, for example, an $SiH_4$ precursor and an $O_2$ precursor), other suitable process, or combinations thereof.

Figure 11:
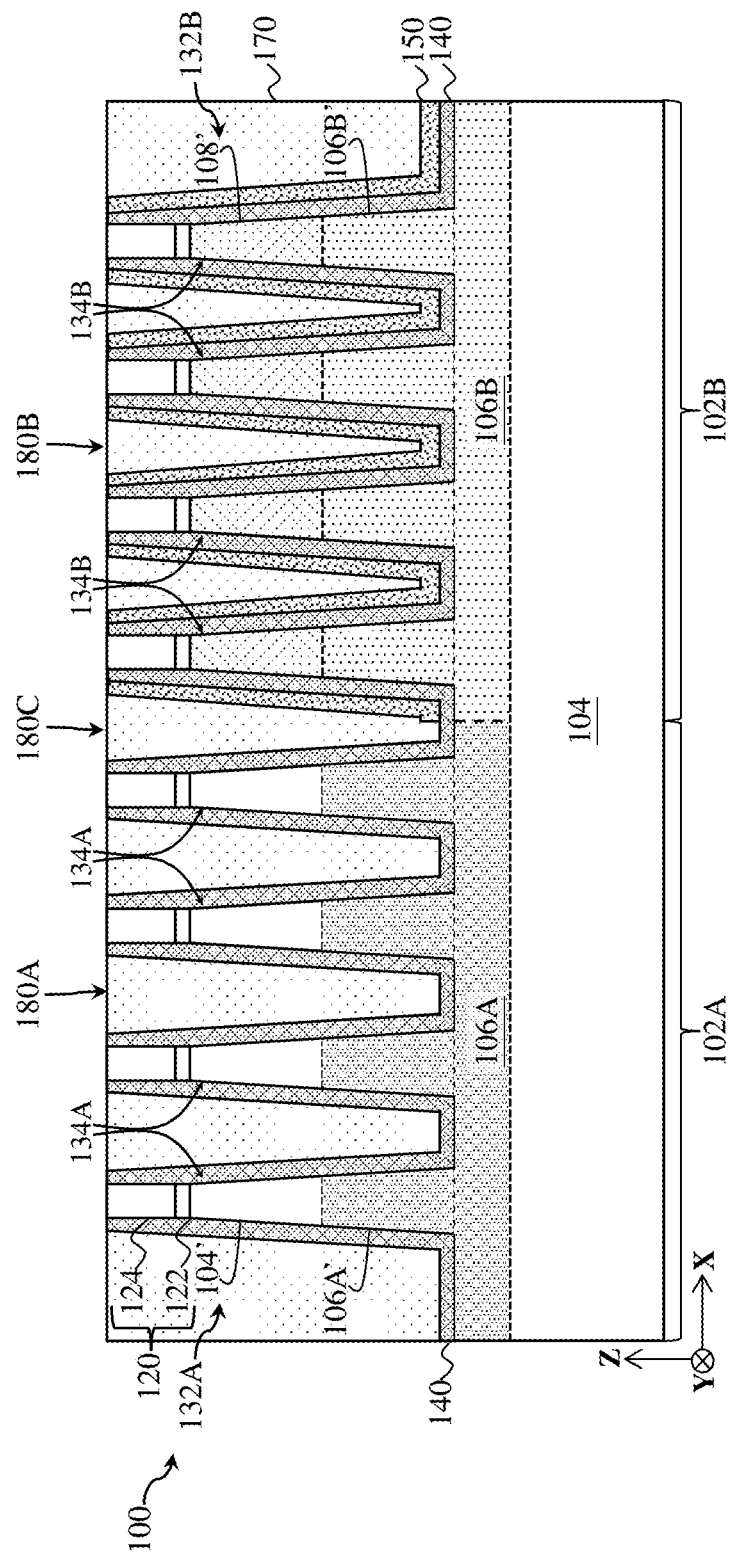

Turning to FIG. 11, a planarization process, such as a chemical mechanical polishing (CMP) process, is performed on isolation material 170, thereby forming isolation features 180A, isolation features 180B, and isolation features 180C. In the depicted embodiment, patterning layer 120 (in particular, mask layer 124) functions as a CMP stop layer, such that the planarization process is performed until reaching and exposing mask layer 124. The planarization process removes isolation material 170, nitride liner 150, and oxide liner 140 disposed over a top surface of patterning layer 120. In some implementations, top surfaces of isolation material 170 and patterning layer 120 are substantially co-planar after the planarization process. In some implementations, an annealing process is subsequently performed to further cure and/or densify isolation material 170 of isolation features 180A-180C.

Isolation features 180A-180C electrically isolate active device regions and/or passive device regions of FinFET device 100 from each other, such as n-type FinFET region 102A and p-type FinFET region 102B. For example, isolation features 180A separate and electrically isolate fins 134A of n-type FinFET region 102A from one another, isolation features 180B separate and electrically isolate fins 134A from fins 134B, and isolation features 180C separate and electrically isolate fins 134B of p-type FinFET region 102B from one another. Isolation features 180A-180C include different liners—isolation feature 180A includes oxide liner 140 disposed on sidewalls of fins 134A (and portions of substrate 104 (here, portions of p-type well 106A defined in substrate 104) extending between fins 134A) and isolation material 170 disposed on oxide liner 140; isolation feature 180B includes oxide liner 140 disposed on sidewalls of fins 134B (and portions of substrate 104 (here, portions of n-type well 106B defined in substrate 104) extending between fins 134B), nitride liner 150 disposed on oxide liner 140, and isolation material 170 is disposed on nitride liner 150; and isolation feature 180C includes oxide liner 140 disposed on sidewalls of fins 134A (and portions of substrate 104 (here, portions of p-type well 106A and/or n-type well 106B defined in substrate 104) extending between fins 134A and fins 134B), nitride liner 150 disposed on a portion of oxide liner 140 (in particular, a portion of oxide liner 140 that is disposed on sidewalls of fins 134B), and isolation material 170 disposed on oxide liner 140 and nitride liner 150. As discussed in detail below, the different isolation liners in n-type FinFET region 102A and p-type FinFET region 102B facilitate uniform fin width of fins 134A, 134B and optimize performance of FinFET devices in n-type FinFET region 102A and p-type FinFET region 102B. Isolation 170 can be referred to as a bulk dielectric and/or bulk dielectric layer of isolation features 180A-180C. Various dimensions and/or characteristics of isolation features 180A-180C can be configured during the processing associated with FIGS. 1-12 to achieve shallow trench isolation (STI) structures, deep trench isolation (DTI) structures, local oxidation of silicon (LOCOS) structures, other suitable isolation structures, or combinations thereof.

Figure 12:
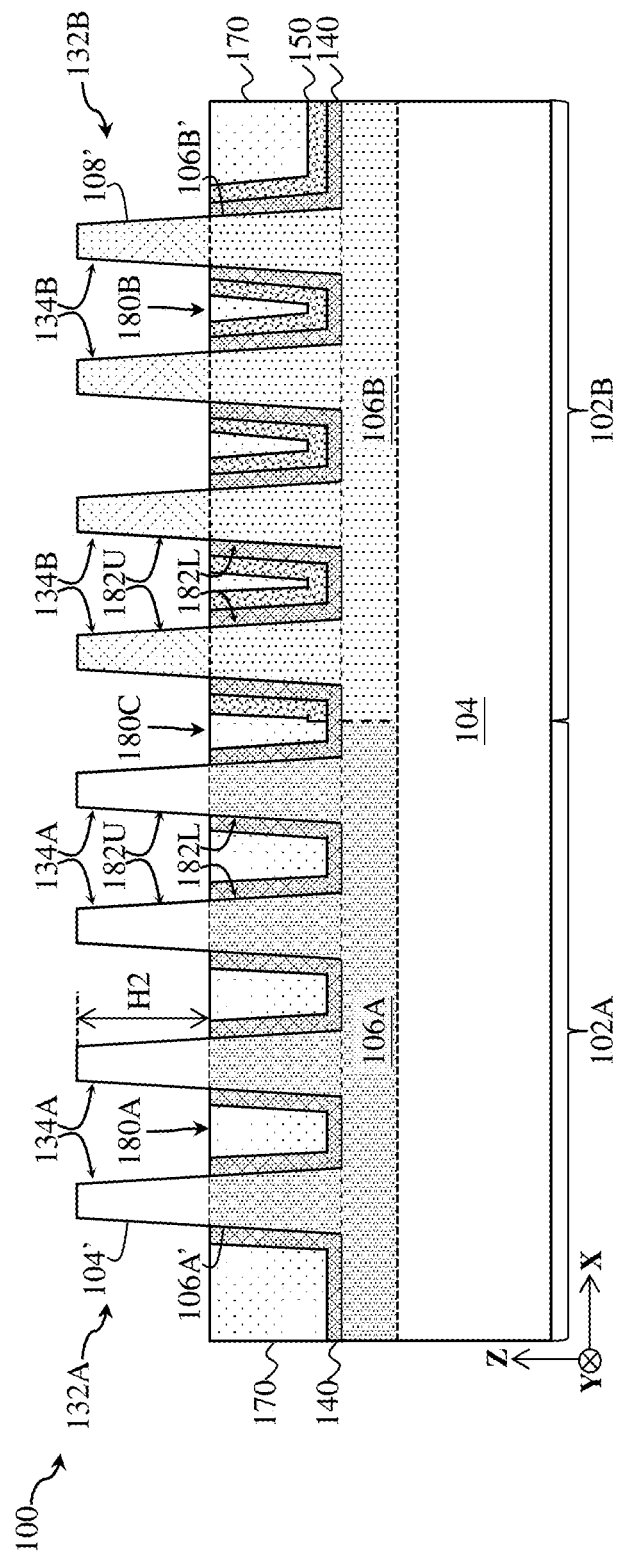

Turning to FIG. 12, isolation features 180A-180C are recessed, such that fins 134A, 134B extend (protrude) from between neighboring isolation features 180A, 180B, and/or 180C. For example, isolation features 180A-180C surround a bottom portion of fins 134A, 134B, thereby defining upper fin active regions 182U of fins 134A, 134B (generally referring to a portion of fins 134A, 134B that extends from a top surface of isolation features 180A-180C) and lower fin active regions 182L of fins 134A, 134B (generally referring to a portion of fins 134A, 134B surrounded by isolation features 180A-180D, which extend from a top surface of substrate 104 (here, top surfaces of n-type well 106A and p-type well 106B defined in substrate 104) to the top surface of isolation features 180A-180D). Upper fin active regions 182U have a height H2 defined between a top surface of isolation features 180A-180C and a top surface of fins 134A, 134B. In some implementations, height H2 is about 50 nm to about 65 nm. In some implementations, an etch back process recesses isolation material 170, nitride liner 150, and oxide liner 140 until achieving a desired (target) height of upper fin active regions 182. In the depicted embodiment, the etch back process proceeds until reaching p-type doped silicon layer 106A' and n-type doped silicon layer 106B', such that silicon layer 104' and silicon germanium layer 108' define upper fin active regions 182. In some implementations, a portion of p-type doped silicon layer 106A' and n-type doped silicon layer 106B' are exposed by the etch back process. In some implementations, only a portion of silicon layer 104' and silicon germanium layer 108' are exposed by the etch back process. The etch back process further removes patterning layer 120 (here, mask layer 124 and pad layer 122) from over fins 134A, 134B. The etch back process is a dry etching process, a wet etching process, or a combination thereof. The etch back process selectively etches isolation material 170, nitride liner 150, oxide liner 140, and patterning layer 120 without (or minimally) etching silicon layer 104' and silicon germanium layer 108'. In some implementations, an etching chemistry can be tuned throughout the etch back process to selectively etch silicon oxide and silicon nitride.

Figure 13A:
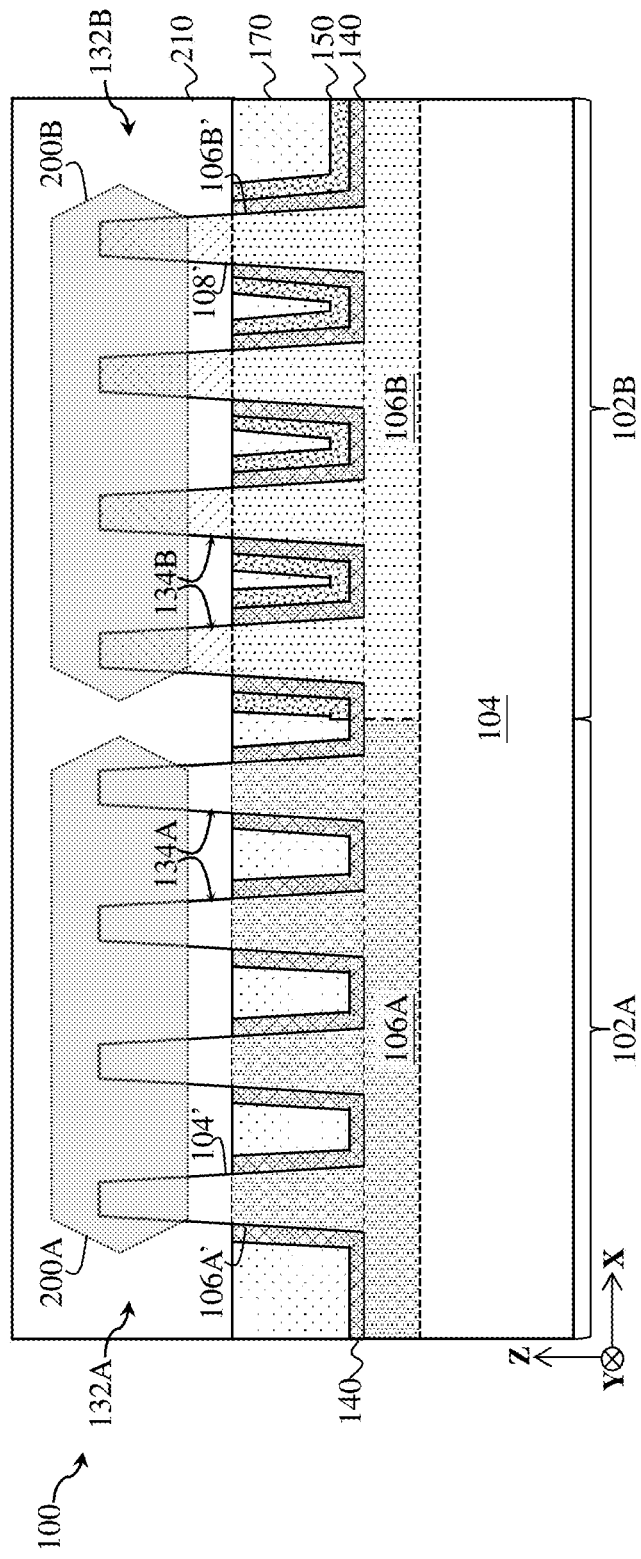
Figure 13B:
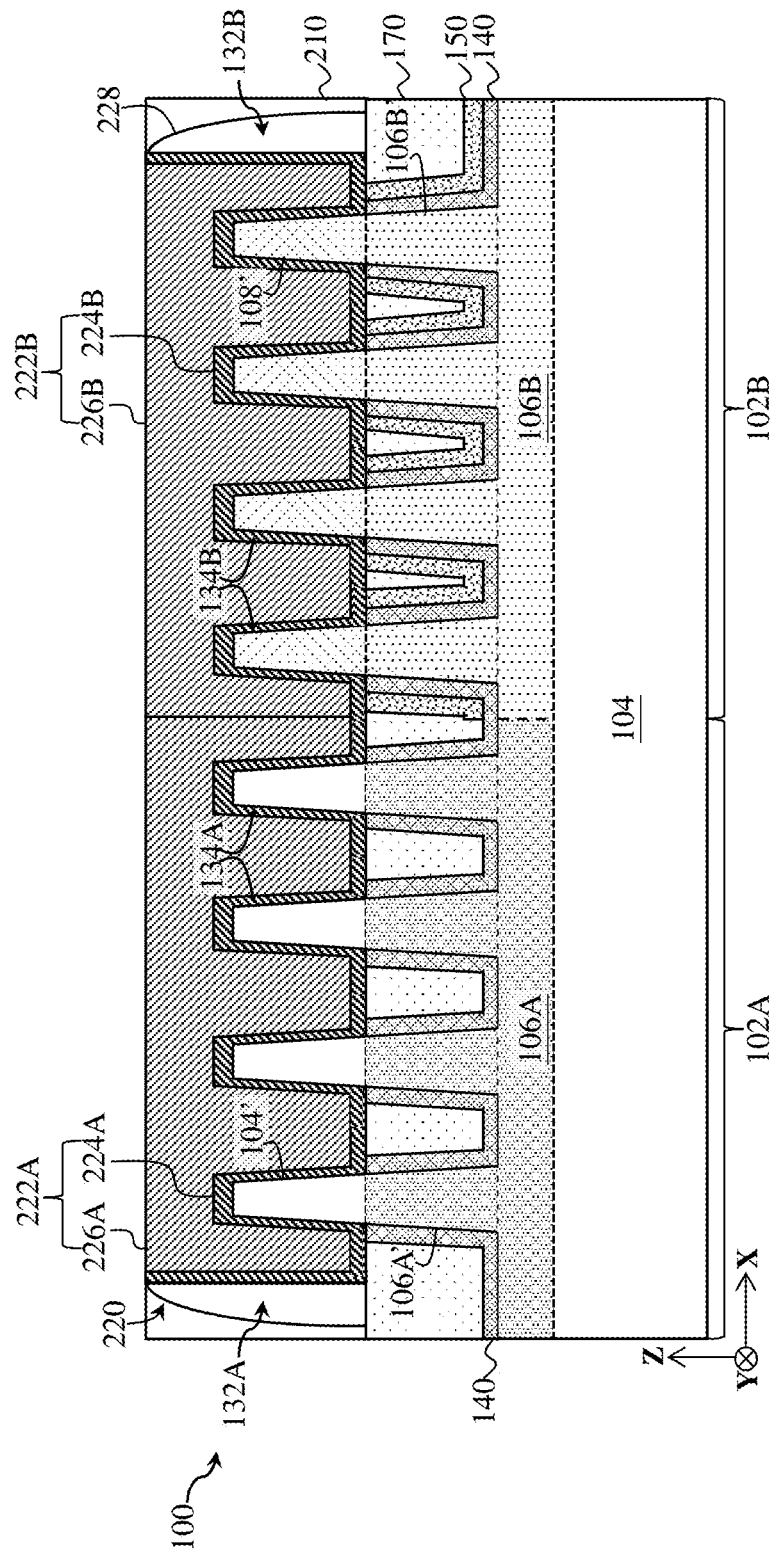

Turning to FIG. 13A and FIG. 13B, fabrication of FinFET device 100 can continue. For example, fabrication can continue with forming a dummy gate, forming epitaxial source/drain features, forming an interlevel dielectric (ILD) layer, replacing the dummy gate with a metal gate, and forming a multilayer interconnect structure. FIG. 13A and FIG. 13B illustrate FinFET device after metal gate formation but before multilayer interconnect feature formation. FIG. 13A is a cross-sectional view along source/drain regions of fins 134A, 134B of FinFET device 100 (similar to FIGS. 1-12), and FIG. 13B is a cross-sectional view along channel regions of fins 134A, 134B of FinFET device 100.

In FIG. 13A, FinFET device 100 includes epitaxial source/drain features 200A on fins 134A and epitaxial source/drain features 200B on fins 134B disposed in source/drain regions of fins 134A, 134B. In some implementations, epitaxial source/drain features 200A, 200B are formed after forming the dummy gate (which wraps channel regions of fins 134A, 134B, such that the dummy gate is disposed between source/drain regions of fins 134A, 134B) and before replacing the dummy gate with the metal gate. For example, semiconductor material is epitaxially grown on fins 134A, 134B to form epitaxial source/drain features 200A, 200B that wrap at least a portion of upper fin active regions 182U. In some implementations, a fin recess process (for example, an etch back process) is performed on source/drain regions of fins 134A, 134B, such that epitaxial source/drain features 200A, 200B are grown from lower fin active regions 182L or a recessed portion of upper fin active regions 182U. The semiconductor material extends (grows) laterally along the x-direction (in some implementations, substantially perpendicular to fins 134A, 134B), such that epitaxial source/drain features 200A, 200B are merged epitaxial source/drain features that span more than one fin. In some implementations, epitaxial source/drain features 200A, 200B include partially merged portions (with interruption (or gaps) between epitaxial material grown from adjacent fins 134A, 134B) and/or fully merged portions (without interruption (or gaps) between epitaxial material grown from adjacent fins 134A, 134B). An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors, which interact with the composition of fins 134A, 134B (here, silicon layer 104' and silicon germanium layer 108'). Epitaxial source/drain features 200A, 200B are doped with n-type dopants and/or p-type dopants. For example, epitaxial source/drain features 200A are epitaxial layers including silicon and/or carbon, where silicon-containing epitaxial layers or silicon-carbon-containing epitaxial layers are doped with phosphorous, arsenic, other n-type dopant, or combinations thereof (for example, forming a Si:P epitaxial layer, a Si:C epitaxial layer, or a Si:C:P epitaxial layer). In furtherance of the example, epitaxial source/drain features 200B are epitaxial layers including silicon and/or germanium, where the silicon germanium containing epitaxial layers are doped with boron, carbon, other p-type dopant, or combinations thereof (for example, forming a Si:Ge:B epitaxial layer or a Si:Ge:C epitaxial layer). Epitaxial source/drain features 200A can alternatively be referred to as P+ regions and epitaxial source/drain features 200B can alternatively be referred to as N+ regions. In some implementations, epitaxial source/drain features 200A, 200B include materials and/or dopants that achieve desired tensile stress and/or compressive stress in the channel regions. In some implementations, epitaxial source/drain features 200A, 200B are doped during deposition by adding impurities to a source material of the epitaxy process. In some implementations, epitaxial source/drain features 200A, 200B are doped by an ion implantation process subsequent to a deposition process. In some implementations, annealing processes are performed to activate dopants in epitaxial source/drain features 200A, 200B and/or other source/drain features of FinFET device 100, such as HDD regions and/or LDD regions (both of which are not shown in FIG. 13B).

An ILD layer 210 is disposed over substrate 104, particularly over epitaxial source/drain features 200A, 200B and fins 134A, 134B. In some implementations, ILD layer 210 is a portion of a multilayer interconnect (MLI) feature that electrically couples various devices (for example, transistors, resistors, capacitors, and/or inductors) and/or components (for example, gate structures and/or source/drain features) of FinFET device 100, such that the various devices and/or components can operate as specified by design requirements of FinFET device 100. ILD layer 210 includes a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, other low-k dielectric material, or combinations thereof. In some implementations, ILD layer 210 has a multilayer structure having multiple dielectric materials. In some implementations, a contact etch stop layer (CESL) is disposed between ILD layer 210 and epitaxial source/drain features 200A, 200B, fins 134A, 134B, and/or gate structure 210. The CESL includes a material different than ILD layer 210, such as a dielectric material that is different than the dielectric material of ILD layer 210. In the depicted embodiment, where ILD layer 210 includes a low-k dielectric material, the CESL includes silicon and nitrogen (for example, silicon nitride or silicon oxynitride). ILD layer 210 and/or the CESL is formed over substrate 104, for example, by a deposition process (such as CVD, PVD, ALD, FCVD, HDPCVD, MOCVD, RPCVD, PECVD, LPCVD, ALCVD, APCVD, plating, other suitable methods, or combinations thereof) after forming the dummy gate. Subsequent to the deposition of ILD layer 210 and/or the CESL, a CMP process and/or other planarization process is performed, such that a top portion of the dummy gate is reached (exposed).

In FIG. 13B, FinFET device 100 includes a gate structure 220 that extends along the x-direction (for example, substantially perpendicular to fins 134A, 134B) and traverse respective fin structures 132A, 132B, such that gate structure 220 wraps upper fin active regions 182U. Gate structure 220 is disposed over respective channel regions of fins 134A, 134B, thereby interposing respective source/drain regions of fins 134A, 134B (including epitaxial source/drain features 200A, 200B). Gate structure 220 engages the respective channel regions of fins 134A, 134B, such that current can flow between the respective source/drain regions of 134A, 134B during operation. Since gate structure 210 spans n-type FinFET region 102A and p-type FinFET region 102B, gate structure 210 can include different layers in regions corresponding with n-type FinFET region 102A and p-type FinFET region 102B. For example, in the depicted embodiment, gate structure 220 includes a metal gate 222A configured for an n-type FinFET in n-type FinFET region 102A (which includes N+ source/drain regions (which encompasses LDD regions and/or HDD regions corresponding with fins 134A and epitaxial source/drain features 200A)) and a metal gate 222B configured for a p-type FinFET (which includes P+ source/drain regions (which encompasses LDD regions and/or HDD regions corresponding with fins 134B and epitaxial source/drain features 200B)) in p-type FinFET region 102B. Metal gate 222A includes a gate dielectric 224A and a gate electrode 226A, and metal gate 222B includes a gate dielectric 224B and a gate electrode 226B. A number, configuration, and/or materials of layers of gate dielectric 224A and/or gate electrode 226A may be different than a number, configuration, and/or materials of layers of gate dielectric 224B and/or gate electrode 226B. Further, gate dielectrics 224A, 224B and/or gate electrodes 226A, 226B are configured to tune work functions of the n-type FinFET in n-type FinFET region 102A and the p-type FinFET in p-type FinFET region 102B according to design requirements of FinFET device 100. Gate dielectrics 224A, 224B and/or gate electrodes 226A, 226B are fabricated during a gate replacement process, though the present disclosure contemplates other sequencing of forming gate dielectrics 224A, 224B, gate electrodes 226A, 226B, and/or portions thereof. During the gate replacement process, the dummy gate is replaced with metal gates 222A, 222B.

Gate dielectrics 224A, 224B include a dielectric material, such as silicon oxide, high-k dielectric material, other suitable dielectric material, or combinations thereof. In the depicted embodiment, gate dielectrics 224A, 224B include one or more high-k dielectric layers including, for example, hafnium, aluminum, zirconium, lanthanum, tantalum, titanium, yttrium, oxygen, nitrogen, other suitable constituent, or combinations thereof. In some implementations, the one or more high-k dielectric layers include $HfO_2$, HfSiO, HfSiON, HfTaO, HfTiO, HfZrO, $ZrO_2$, $Al_2O_3$, $HfO_2$—$Al_2O_3$, $TiO_2$, $Ta_2O_5$, $La_2O_3$, $Y_2O_3$, other suitable high-k dielectric material, or combinations thereof. High-k dielectric material generally refers to dielectric materials having a high dielectric constant, for example, greater than that of silicon oxide ($k \approx 3.9$). In some implementations, gate dielectrics 224A, 224B further include an interfacial layer (including a dielectric material, such as silicon oxide) disposed between the high-k dielectric layer and respective fins 134A, 134B and isolation features 180A-180C. Gate dielectrics 224A, 224B are formed by various processes, such as ALD, CVD, PVD, and/or other suitable process.

Gate electrodes 226A, 226B are respectively disposed over gate dielectrics 224A, 224B. Gate electrodes 226A, 226B include an electrically conductive material. In some implementations, gate electrodes 226A, 226B includes multiple layers, such as one or more capping layers, work function layers, glue/barrier layers, and/or metal fill (or bulk) layers. A capping layer can include a material that prevents or eliminates diffusion and/or reaction of constituents between gate dielectrics 224A, 224B and other layers of gate structure 220 (in particular, gate layers including metal). In some implementation, the capping layer includes a metal and nitrogen, such as titanium nitride (TiN), tantalum nitride (TaN), tungsten nitride ($W_2N$), titanium silicon nitride (TiSiN), tantalum silicon nitride (TaSiN), or combinations thereof. A work function layer can include a conductive material tuned to have a desired work function (such as an n-type work function or a p-type work function), such as n-type work function materials and/or p-type work function materials. P-type work function materials include TiN, TaN, Ru, Mo, Al, WN, $ZrSi_2$, $MoSi_2$, $TaSi_2$, $NiSi_2$, WN, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. A glue/barrier layer can include a material that promotes adhesion between adjacent layers, such as the work function layer and the metal fill layer, and/or a material that blocks and/or reduces diffusion between gate layers, such as such as the work function layer and the metal fill layer. For example, the glue/barrier layer includes metal (for example, W, Al, Ta, Ti, Ni, Cu, Co, other suitable metal, or combinations thereof), metal oxides, metal nitrides (for example, TiN), or combinations thereof. A metal fill layer can include a suitable conductive material, such as Al, W, and/or Cu. In some implementations, a hard mask layer (including, for example, silicon nitride or silicon carbide) is disposed over at least a portion of gate electrodes 226A, 226B. Gate electrodes 226A, 226B are formed by various deposition processes, such as ALD, CVD, PVD, and/or other suitable process.

Gate structure 220 further include gate spacers 228 disposed adjacent to (for example, along sidewalls of) metal gates 222A, 222B. Gate spacers 228 are formed by any suitable process and include a dielectric material. The dielectric material can include silicon, oxygen, carbon, nitrogen, other suitable material, or combinations thereof (for example, silicon oxide, silicon nitride, silicon oxynitride, or silicon carbide). For example, in the depicted embodiment, a dielectric layer including silicon and nitrogen, such as a silicon nitride layer, can be deposited and subsequently anisotropically etched to form gate spacers 228. In some implementations, gate spacers 228 include a multi-layer structure, such as a first dielectric layer that includes silicon nitride and a second dielectric layer that includes silicon oxide. In some implementations, gate spacers 228 include more than one set of spacers, such as seal spacers, offset spacers, sacrificial spacers, dummy spacers, and/or main spacers, formed adjacent to the gate stacks. In such implementations, the various sets of spacers can include materials having different etch rates. For example, a first dielectric layer including silicon and oxygen can be deposited over substrate 16 and subsequently anisotropically etched to form a first spacer set adjacent to the gate stacks, and a second dielectric layer including silicon and nitrogen can be deposited over substrate 16 and subsequently anisotropically etched to form a second spacer set adjacent to the first spacer set. In some implementations, gate spacers 228 are formed after forming the dummy gate. Implantation, diffusion, and/or annealing processes may be performed to form LDD features and/or HDD features (both of which are not shown in FIGS. 13A, 13B) in source/drain regions of fins 134A, 134B before and/or after forming gate spacers 228.

Using different liners for isolation features in n-type regions, such as n-type FinFET region 102A, and p-type regions, such as p-type FinFET region 102B, has been observed to balance fin width in the n-type regions and p-type regions during subsequent processing, such that n-type FinFETs and p-type FinFETs have substantially the same fin widths after annealing processes performed while forming the isolation features. In particular, implementing an oxide isolation liner for n-type FinFETs increases consumption of n-type fins (here, silicon fins) while implementing an oxide liner plus nitride liner for p-type FinFETs decreases consumption of p-type fins (here, silicon germanium fins) during isolation feature anneals, such as STI annealing associated with an FCVD process. The different isolation liners thus equalize consumption of the n-type fins and p-type fins, achieving improved fin width uniformity. For example, when implementing a nitride liner in both n-type regions and p-type regions, fin widths in n-type regions have been observed to be about 1 nm to about 2 nm greater than fin widths in p-type regions after undergoing subsequent processing. In specific implementations, it has been observed that fin widths in n-type regions are about 7.0 nm to about 8.0 nm while fin widths in p-type regions are about 5.5 nm to about 6.5 nm. In contrast, removing the nitride liner from the n-type regions, such that the isolation liner is substantially free of nitrogen in the n-type regions, has been observed to reduce such fin width differences to less than or equal to about 0.5 nm. In specific implementations, removing the nitride liner from the n-type region has been observed to achieve fin widths in both the n-type regions and the p-type regions that are about 5.0 nm to about 6.5 nm after undergoing subsequent processing. In some implementations, no significant width differences are observed between fins in the n-type regions and the p-type regions when the n-type regions are free of nitride liners in their isolation features. Fin width uniformity is thus improved, in some implementations, by at least 85% by using different liners for different type FinFETs. Different embodiments may have different advantages, and no particular advantage is necessarily required of any embodiment.

Figure 14:
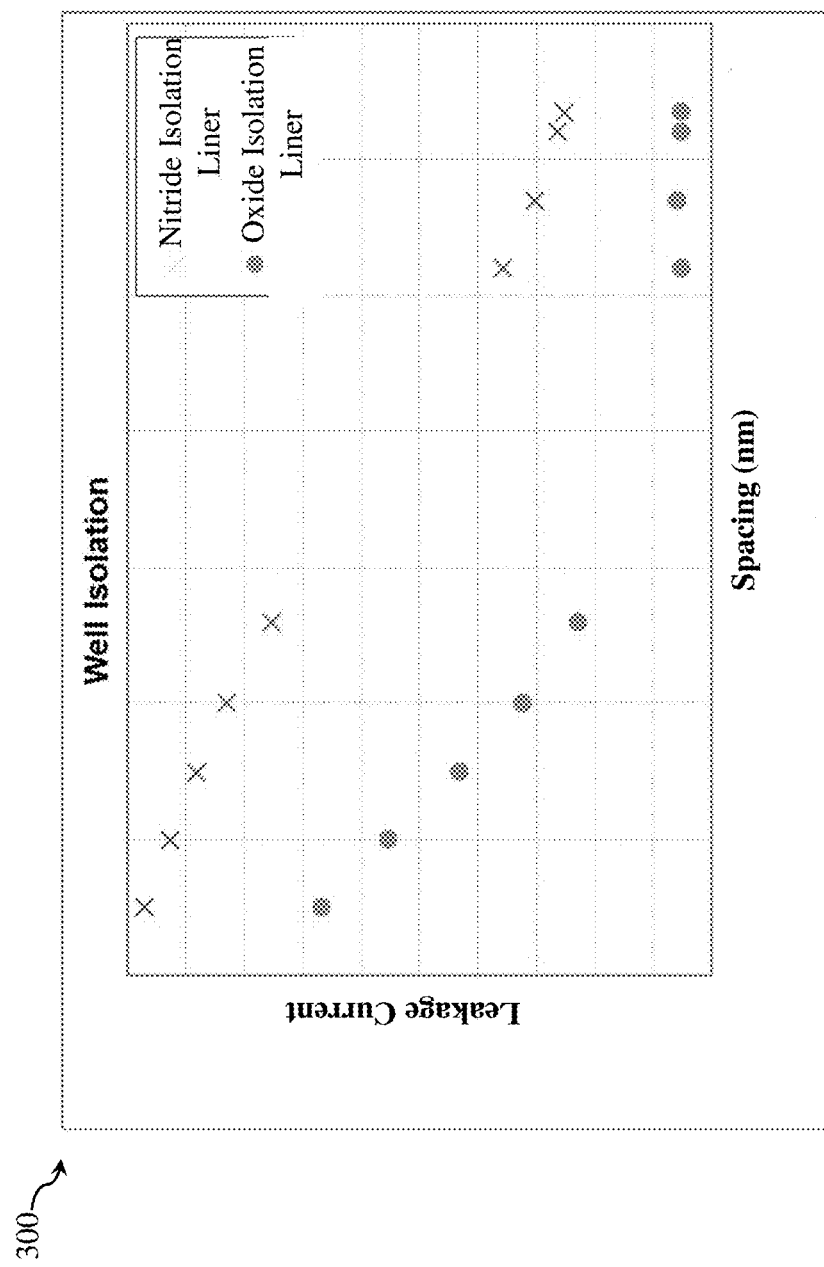
FIG. 14 is a graph illustrating effects of different isolation liners on well isolation between FinFET devices according to various aspects of the present disclosure.

Further, fixed charges localized at an interface between a nitride liner and a silicon fin (such as those implemented in n-type FinFETs) have been observed to cause a current path between N+ source/drain regions of n-type FinFETs. For example, a current path may exist from N+ source/drain regions of a first n-type FinFET through a p-type well (over which the first n-type FinFET is disposed) and an n-type well (over which a second n-type FinFET is disposed) to N+ source/drain regions of the second n-type FinFET. The n-type well over which the second n-type FinFET is disposed is an n-type well pick-up region used for isolation purposes. Such transistor-to-transistor leakage path can degrade performance of n-type FinFETs. Removing nitride liner from isolation features for n-type FinFETs significantly reduces (and, in some implementations, eliminates) such leakage path, even as spacing between fins decreases to meet miniaturization demands of advanced IC technology nodes. This phenomenon is illustrated in FIG. 14, which provides a graph 300 illustrating effects of different isolation liners on well isolation (for example, between a first n-type FinFET disposed over an n-type well and a second n-type FinFET disposed over a p-type well, such as described above) according to various aspects of the present disclosure. In FIG. 14, a horizontal axis represents spacing between fins in nanometers (nm) and a vertical axis represents a leakage current detected from a current path between source/drain regions (for example, between N+ source/drain regions of the first n-type FinFET and the second n-type FinFET). X data points indicate leakage current observed when isolation features used to isolate the n-type FinFETs include an isolation liner having only a nitride liner. O data points indicate leakage current observed when isolation features used to isolate the n-type FinFETs include an isolation liner having only an oxide liner. As seen in FIG. 14, for both isolation liner types, leakage current decreases as fin spacing increases. However, leakage current observed when oxide liners are used in the isolation features between n-type FinFETs is significantly less than leakage current observed when nitride liners are used in the isolation features between n-type FinFETs. Turning again to FIG. 13A and FIG. 13B, in FinFET device 100, oxide liner 140 of isolation features 180A thus reduces fixed charges at the isolation liner/fin interface, thereby reducing leakage from source/drain regions of fins 134A to n-type wells, such as n-type well 106B. In some implementations, n-type FinFETs are electrically isolated by isolation features having liners substantially free of nitrogen to minimize any fixed charge at the isolation liner/fin interface. Further, nitride isolation liners for p-type FinFETs have been observed to prevent damage to p-type fins (such as silicon germanium fins) during isolation anneal processes, such as damage caused by oxygen-containing environments often implemented in such processes, which can improve carrier mobility in p-type FinFETs. Nitride liner 150 is thus incorporated into isolation features 180B to minimize damage to fins 134B during processing. Different embodiments may have different advantages, and no particular advantage is necessarily required of any embodiment.

The present disclosure contemplates variations in heights, widths, and/or lengths of fins 134A, 134B that may arise from processing and fabrication of FinFET device 100. However, it is noted that the isolation feature fabrication methods disclosed herein achieve substantially uniform fin widths of fins 134A, 134B, such that average widths of fins 134A are substantially equal to average widths of fins 134B (in some implementations, within 5% of one another). In the depicted embodiment, fins 134A, 134B have tapered widths along their respective heights, where the widths decrease along the heights of fins 134A, 134B. In some implementations, widths of fins 134A, 134B represent an average of a varying width of upper fin active regions 182U of fins 134A, 134B. In such implementations, widths decrease from a top surface of isolation features 180A-180C to a top surface of fins 134A, 134B, such that the widths each represent an average of the decreasing widths of upper fin active regions 182U along their heights. In some implementations, the widths represent an average of a varying width of an entirety of respective fins 134A, 134B. In some implementations, the widths can vary from about 5 nm to about 15 nm along fins 134A, 134B depending on where the widths are measured along heights of fins 134A, 134B. In some implementations, fin width varies depending on a position of a fin relative to other fins and/or relative to other features of FinFET device 10. For example, widths of center fins (in the depicted embodiment, fin structures 132A, 132B each include two center fins) is greater than widths of edge fins (here, a leftmost fin and a rightmost fin enclosing the two center fins of fin structures 132A, 132B). In another example, alternatively, widths of the center fins are less than widths of the edge fins. In furtherance of such implementations, respective widths of the edge fins and the center fins can represent respective average widths of the edge fins and the center fins in any manner as described herein. Though fins 134A, 134B are depicted as having tapered widths, in some implementations, fins 134A, 134B have substantially the same widths along their respective heights.

Different isolation liners for different type FinFETs and associated isolation feature fabrication are disclosed herein. An exemplary method includes performing a fin etching process on a substrate to form first trenches that define first fins in a first region and second trenches that define second fins in a second region. An oxide liner is formed over the first fins in the first region and the second fins in the second region. A nitride liner is formed over the oxide liner in the second region. An isolation material is formed over the oxide liner and the nitride liner. The isolation material fills the first trenches and the second trenches. The isolation material, the oxide liner, and the nitride liner are recessed, thereby forming first isolation features and second isolation features. In some implementations, forming the nitride liner over the oxide liner in the second region includes depositing the nitride liner over the oxide liner in the first region and the second region, forming a patterning layer that covers the nitride liner in the second region and exposes the nitride liner in the first region, removing the nitride liner from the second region, and removing the patterning layer. In some implementations, a material of the first fins is different than a material of the second fins.

In some implementations, the fin etching process includes forming a patterned mask layer over the substrate, where the patterned mask layer includes a plurality of openings that expose the substrate, and etching the substrate exposed by the plurality of openings. In some implementations, the oxide liner, the nitride liner, and the isolation material are further formed over the patterned mask layer. In such implementations, the method can further include performing a planarization process until the patterned mask layer is exposed, where the planarization process removes the isolation material, the nitride liner, and the oxide liner disposed thereover. In some implementations, forming the isolation material includes depositing a flowable material that fills the first trenches and the second trenches and performing an annealing process to convert the flowable material into a solid material. In some implementations, recessing the isolation material, the oxide liner, and the nitride liner includes performing a selective etching process.

Another exemplary method includes etching a substrate to form a first trench adjacent to a first fin and a second trench adjacent to a second fin, where the first fin is different than the second fin; depositing an oxygen-containing liner over sidewalls and bottoms of the first trench and the second trench; depositing a silicon-and-nitrogen containing liner over the sidewalls and bottoms of the second trench, where the silicon-and-nitrogen containing liner is disposed over the oxygen-containing liner; depositing an isolation material over the oxygen-containing liner and the silicon-and-nitrogen containing liner, where the isolation material fills the first trench and the second trench; and etching back the isolation material, the silicon-and-nitrogen containing layer, and the oxygen-containing liner.

In some implementations, depositing the oxygen-containing liner includes performing an atomic layer deposition process. In some implementations, depositing the silicon-and-nitrogen containing liner includes performing an atomic layer deposition process. In some implementations, depositing the isolation material includes performing a flowable chemical vapor deposition process. In some implementations, the first fin is a silicon-containing fin and the second fin is a silicon-and-germanium containing fin. In some implementations, etching back includes removing the isolation material and the oxygen-containing liner disposed over an upper portion of the first fin and removing the isolation material, the silicon-and-nitrogen containing layer, and the oxygen-containing liner disposed over an upper portion of the second fin. In some implementations, etching the substrate forms a third trench, such that the oxygen-containing liner is further deposited over sidewalls and bottom of the third trench, the silicon-and-nitrogen containing liner is further deposited over at least one of the sidewalls of the third trench, and the isolation material fills the third trench.

An exemplary integrated circuit device includes a first isolation feature configured to isolate first fins of a first FinFET device and a second isolation feature configured to isolate second fins of a second FinFET device. The first isolation feature includes a first oxide liner disposed over a bottom portion of the first fins and a first isolation fill material disposed on the first oxide liner. The second isolation feature includes a second oxide liner disposed over a bottom portion of the second fins, a nitride liner disposed over the second oxide liner, and a second isolation fill material disposed on the nitride liner. In some implementations, the first FinFET device is an n-type FinFET device and the second FinFET device is a p-type FinFET. In some implementations, the first isolation fill material and the second isolation fill material include silicon and oxygen. In some implementations, the first fins include silicon and the second fins include silicon and germanium.

In some implementations, the nitride liner is a first nitride liner, and the integrated circuit device further includes a third isolation feature configured to isolate the first FinFET device from the second FinFET device. The third isolation feature includes a third oxide liner disposed over a bottom portion of one of the first fins, a second nitride liner disposed over a bottom portion of one of the second fins, and a third isolation fill material disposed on the second oxide liner and the second nitride liner. The third oxide liner may be disposed between the second nitride liner and the bottom portion of the one of the second fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    etching a substrate to form a first trench adjacent to a first fin and a second trench adjacent to a second fin, wherein the first fin is different than the second fin;
    depositing an oxygen-containing liner that partially fills the first trench and the second trench, wherein the oxygen-containing liner is disposed over sidewalls and bottoms of the first trench and the second trench;
    depositing a silicon-and-nitrogen containing liner that partially fills the first trench and the second trench, wherein the silicon-and-nitrogen containing liner is disposed over the oxygen-containing liner;
    completely removing the silicon-and-nitrogen containing liner from the first trench;
    depositing an isolation material over the oxygen-containing liner in the first trench and the silicon-and-nitrogen containing liner in the second trench, wherein the isolation material fills a remaining portion of the first trench and the second trench; and
    etching back the isolation material, the silicon-and-nitrogen containing liner, and the oxygen-containing liner.

2. The method of claim 1, wherein the depositing the oxygen-containing liner includes performing an atomic layer deposition process.

3. The method of claim 1, wherein the depositing the silicon-and-nitrogen containing liner includes performing an atomic layer deposition process.

4. The method of claim 1, wherein the depositing the isolation material includes performing a flowable chemical vapor deposition process.

5. The method of claim 1, wherein the first fin is a silicon-containing fin and the second fin is a silicon-and-germanium containing fin.

6. The method of claim 1, wherein the etching back includes:
    removing the isolation material and the oxygen-containing liner disposed over an upper portion of the first fin; and
    removing the isolation material, the silicon-and-nitrogen containing liner, and the oxygen-containing liner disposed over an upper portion of the second fin.

7. The method of claim 1, wherein:
    the etching the substrate further includes forming a third trench;
    the depositing the oxygen-containing liner partially fills the third trench, such that the oxygen-containing liner is disposed over sidewalls and bottoms of the third trench;
    the depositing the silicon-and-nitrogen containing liner partially fills the third trench;
    the removing the silicon-and-nitrogen containing liner includes removing the silicon-and-nitrogen containing liner from over at least one of the sidewalls of the third trench; and
    the depositing the isolation material fills a remaining portion of the third trench.

8. The method of claim 1, wherein the depositing the oxygen-containing liner includes exposing the first fin and the second fin to an oxygen-containing environment, thereby oxidizing surfaces of the first fin and the second fin.

9. The method of claim 1, wherein the oxygen-containing liner has a first thickness, the silicon-and-nitrogen containing liner has a second thickness, and the second thickness is greater than the first thickness.

10. The method of claim 1, wherein the removing the silicon-and-nitrogen containing liner from the first trench includes:
    forming a patterning layer that covers the silicon-and-nitrogen containing liner in the second trench and exposes the silicon-and-nitrogen containing liner in the first trench; and
    performing an etching process that selectively removes the silicon-and-nitrogen containing liner from the first trench without removing the oxygen-containing liner.

11. A method comprising:
    performing a first atomic layer deposition process to form an oxygen-containing liner that partially fills a first trench and a second trench, wherein the first trench is adjacent to a first fin, the second trench is adjacent to a second fin, and the first fin is different than the second fin;
    performing a second atomic layer deposition process to form a silicon-and-nitrogen containing liner that partially fills the first trench and the second trench, wherein the silicon-and-nitrogen containing liner is disposed over the oxygen-containing liner;
    after removing the silicon-and-nitrogen containing liner from the first trench, performing a chemical vapor deposition process to form an isolation material over the oxygen-containing liner in the first trench and the silicon-and-nitrogen containing liner in the second trench, wherein the isolation material fills a remaining portion of the first trench and a remaining portion of the second trench; and
    etching back the isolation material, the silicon-and-nitrogen containing layer, and the oxygen-containing liner.

12. The method of claim 11, wherein:
    the first atomic layer deposition process implements a first silicon-containing precursor and an oxygen-containing plasma; and
    the second atomic layer deposition process implements a second silicon-containing precursor and a nitrogen-containing precursor.

13. The method of claim 11, further comprising performing a planarization process on the isolation material before the etching back.

14. The method of claim 11, further comprising forming the first fin and the second fin by:
    providing a first semiconductor layer;
    forming a first doped region and a second doped region in the first semiconductor layer;

forming a masking layer over the first semiconductor layer, wherein the masking layer covers the first doped region in the first semiconductor layer;
etching the first semiconductor layer to form a recess that exposes the second doped region in the first semiconductor layer;
forming a second semiconductor layer over the second doped region of the first semiconductor layer; and
after removing the masking layer, patterning the first semiconductor layer and the second semiconductor layer, wherein:
the first fin includes a first portion of the first semiconductor layer disposed over a second portion of the first semiconductor layer, the second portion of the first semiconductor layer including the first doped region, and
the second fin includes a portion of the second semiconductor layer disposed over a third portion of the first semiconductor layer, the third portion of the first semiconductor layer including the second doped region.

15. The method of claim 11, wherein the oxygen-containing liner has a first thickness, the silicon-and-nitrogen containing liner has a second thickness, and a ratio of the first thickness to the second thickness is about 2:3.

16. A method comprising:
forming a silicon-containing fin and a silicon-and-germanium containing fin over a substrate, wherein a first trench is adjacent to the silicon-containing fin and a second trench is adjacent to the silicon-and-germanium containing fin;
depositing an oxygen-containing liner over the silicon-containing fin and the silicon-and-germanium containing fin, wherein the oxygen-containing liner partially fills the first trench and the second trench, and further wherein the oxygen-containing liner is disposed over sidewalls and bottoms of the first trench and the second trench;
depositing a silicon-and-nitrogen containing liner over the silicon-containing fin and the silicon-and-germanium containing fin, wherein the silicon-and-nitrogen containing liner partially fills the first trench and the second trench, and further wherein the silicon-and-nitrogen containing liner is disposed over the oxygen-containing liner;
after removing the silicon-and-nitrogen containing liner from the first trench and from over the silicon-containing fin, depositing an isolation material over the silicon-containing fin, the silicon-and-germanium containing fin, the oxygen-containing liner in the first trench, and the silicon-and-nitrogen containing liner in the second trench, wherein the isolation material fills a remaining portion of the first trench and the second trench; and
etching back the isolation material, the silicon-and-nitrogen containing liner, and the oxygen-containing liner.

17. The method of claim 16, wherein:
a third trench is disposed between the first trench and the second trench;
the depositing the oxygen-containing liner partially fills the third trench, such that the oxygen-containing liner is disposed over sidewalls and a bottom of the third trench;
the depositing the silicon-and-nitrogen containing liner partially fills the third trench;
the removing the silicon-and-nitrogen containing liner includes removing the silicon-and-nitrogen containing liner from over at least one of the sidewalls of the third trench; and
the depositing the isolation material fills a remaining portion of the third trench.

18. The method of claim 16, further comprising performing a planarization process on the isolation material before the etching back, wherein the planarization process stops upon reaching a first mask layer disposed over the silicon-containing fin and a second mask layer disposed over the silicon-and-germanium containing fin.

19. The method of claim 18, wherein the etching back includes removing the first mask layer and the second mask layer.

* * * * *